US010220618B2

(12) United States Patent
Ashikaga

(10) Patent No.: US 10,220,618 B2
(45) Date of Patent: Mar. 5, 2019

(54) INK JET PRINT HEAD AND METHOD OF MANUFACTURING THE SAME

(71) Applicant: ROHM Co., LTD., Kyoto (JP)

(72) Inventor: Kinya Ashikaga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/697,746

(22) Filed: Sep. 7, 2017

(65) Prior Publication Data

US 2018/0079210 A1 Mar. 22, 2018

(30) Foreign Application Priority Data

Sep. 20, 2016 (JP) .................................. 2016-183173

(51) Int. Cl.
*B41J 2/14* (2006.01)
*B41J 2/16* (2006.01)
(Continued)

(52) U.S. Cl.
CPC ......... *B41J 2/14201* (2013.01); *B41J 2/1607* (2013.01); *B41J 2/1626* (2013.01); *B41J 2/1631* (2013.01); *H01L 41/0472* (2013.01); *H01L 41/293* (2013.01); *H01L 41/318* (2013.01); *H01L 41/332* (2013.01)

(58) Field of Classification Search
CPC .................................................. B41J 2/14233
See application file for complete search history.

(56) References Cited

U.S. PATENT DOCUMENTS

2003/0156165 A1* 8/2003 Sakaida ............... B41J 2/14209
347/68
2012/0299997 A1* 11/2012 Munakata ............ B41J 2/14233
347/47
(Continued)

FOREIGN PATENT DOCUMENTS

JP 2017114032 A * 6/2017

OTHER PUBLICATIONS

Machine generated English translation of JP2017-114032A to Mikoshiba et al., "Liquid Injection Head and Liquid Injection Device"; translation retrieved via https://worldwide.espacenet.com/publicationDetails/biblio?DB=EPODOC&II=0&ND=3&adjacent=true&locale=en_EP&FT=D&date=20170629&CC=JP&NR=2017114032A&KC=A# on May 17, 2018; 46pp.*

*Primary Examiner* — Shelby L Fidler
(74) *Attorney, Agent, or Firm* — Chip Law Group

(57) ABSTRACT

A ink jet print head includes an actuator substrate having an ink flow path including a pressure chamber, a movable membrane forming layer including a movable membrane disposed on the pressure chamber and defining a ceiling surface portion of the pressure chamber, a piezoelectric element formed on the movable membrane and including a lower electrode, a piezoelectric film formed on the lower electrode and an upper electrode formed on the piezoelectric film, with the pressure chamber, the movable membrane and the upper electrode having a rectangular shape elongated in one direction in plan view as viewed from a direction normal to the movable membrane, the lower electrode including a main electrode section constituting the piezoelectric element and an extension section extending from the main electrode section along a surface of the movable membrane forming layer, and a dimension measuring pattern related to the pressure chamber.

16 Claims, 37 Drawing Sheets

(51) Int. Cl.
*H01L 41/047* (2006.01)
*H01L 41/293* (2013.01)
*H01L 41/332* (2013.01)
*H01L 41/318* (2013.01)

(56) References Cited

U.S. PATENT DOCUMENTS

2014/0292949 A1* 10/2014 Yazaki .................. B41J 2/14201
                                                          347/71
2016/0027988 A1*  1/2016 Nagahata ............ H01L 41/0472
                                                          347/70

* cited by examiner

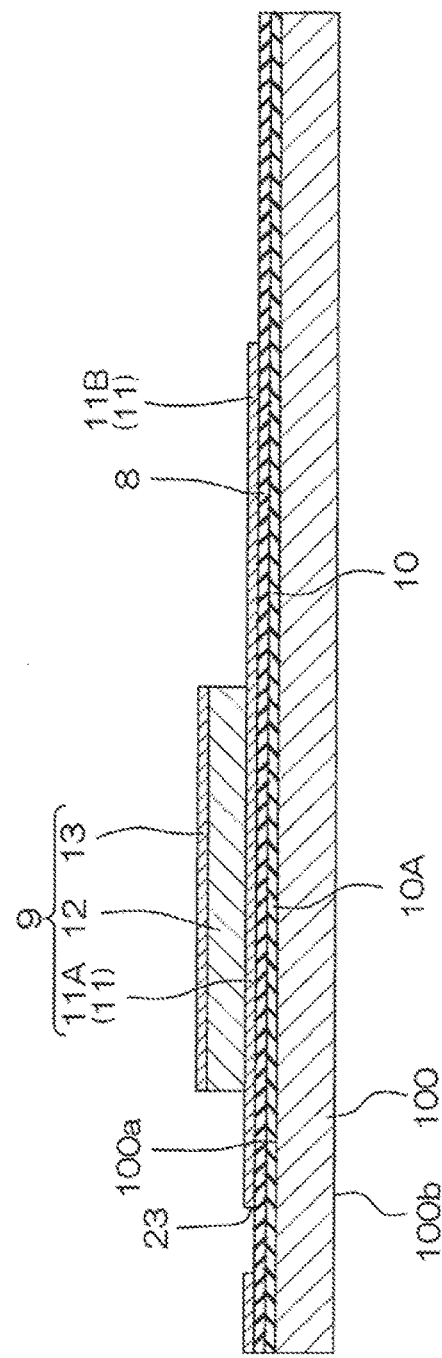

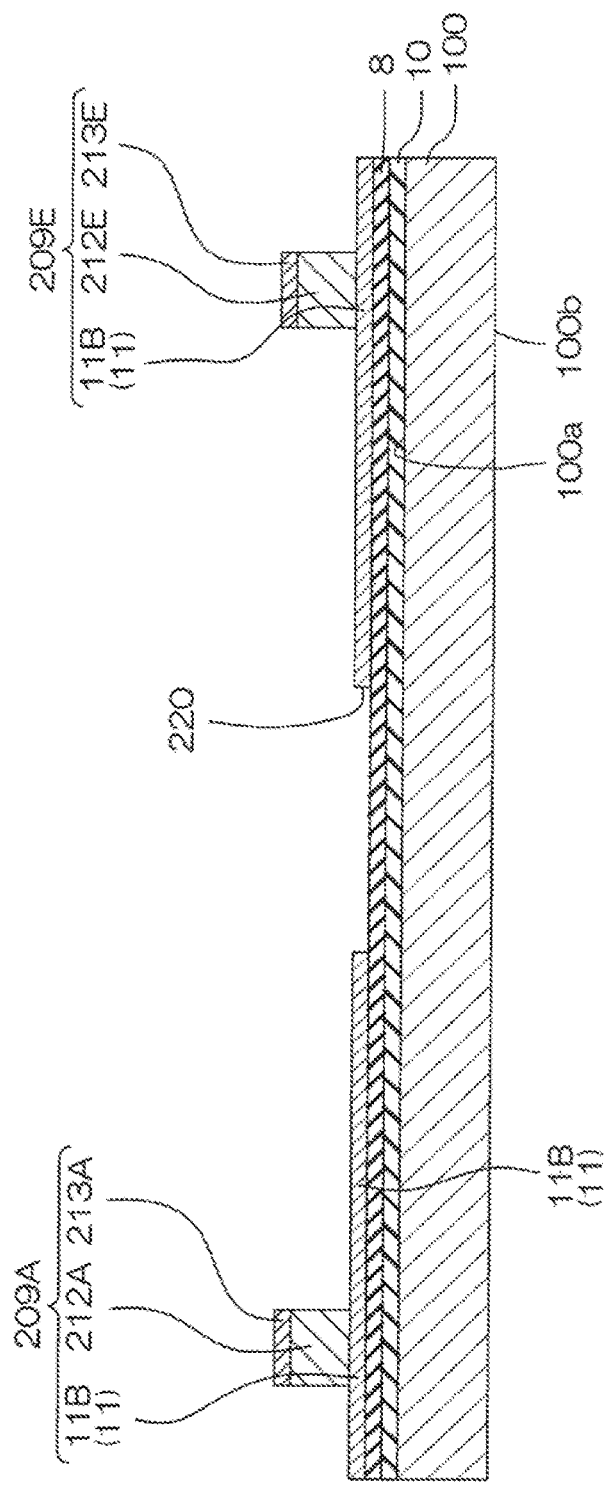

INK JET PRINT HEAD AND METHOD OF MANUFACTURING THE SAME

CROSS REFERENCE TO RELATED APPLICATIONS

This U.S. Application claims priority benefit of Japanese Patent Application No. JP 2016-183173 filed in the Japan Patent Office on Sep. 20, 2016. Each of the above-referenced applications is hereby incorporated herein by reference in its entirety.

BACKGROUND

The present disclosure relates to an ink jet print head and a method of manufacturing the same.

Japanese Patent Laid-open No. 2015-91668 discloses an ink jet print head. The ink jet print head of Japanese Patent Laid-open No. 2015-91668 includes an actuator substrate (substrate) having pressure chambers (pressure generation chambers) as ink flow paths, movable membranes (elastic membranes) formed on the actuator substrate, and piezoelectric elements provide on the movable membranes. The ink jet print head of Japanese Patent Laid-open No. 2015-91668 further includes a nozzle substrate (nozzle plate) which is joined to the lower surface of the actuator substrate and which has nozzle openings communicating with the pressure chambers, and a protective substrate which is joined to the upper surface of the actuator substrate and which covers the piezoelectric elements. The piezoelectric element includes a first electrode film (lower electrode) formed on the movable membrane, a second electrode film (upper electrode) disposed on the first electrode film, and a piezoelectric layer (piezoelectric film) interposed between the first and second electrode films.

The actuator substrate is formed therein with individual ink supply passages communicating with the pressure chambers, and a common ink supply passage (communicating section) communicating with the individual ink supply passages. In other words, the actuator substrate is formed therein with ink flow paths which include the common ink supply passage, the individual ink supply passages and the pressure chambers. The lower surface of the protective substrate is formed with accommodating recesses (piezoelectric element holding sections) in which to accommodate the piezoelectric elements. In addition, the protective substrate is formed with an ink supply passage (reservoir section) communicating with the common ink supply passage of the actuator substrate, at a position spaced from the accommodating recesses in plan view. An ink is supplied from an ink tank to the pressure chambers through the ink supply passage of the protective substrate, and the common ink supply passage and the individual ink supply passages of the actuator substrate.

SUMMARY

In the ink jet print head as described in Japanese Patent Laid-open No. 2015-91668, in general, displacement characteristics of the movable membrane vary depending on the dimensions of the pressure chamber, a deviation in the relative positions of the pressure chamber and the piezoelectric element, etc. The dimensions of the pressure chamber that influence the displacement characteristics of the movable membrane are dimensions of the pressure chamber on the movable membrane side. In the case of optically measuring the dimensions of the pressure chamber, however, there arises a problem as follows. In an ink jet print head of a structure in which a lower electrode is formed in such a manner as to cover that surface of the movable membrane which is on the side opposite to the pressure chamber side, it is difficult to measure the dimensions of the pressure chamber on the movable membrane side, although it is possible to measure the dimensions of the pressure chamber on the side opposite to the movable membrane side.

Thus, there is a need for an ink jet print head and a method of manufacturing the same by which the dimensions of a pressure chamber on the movable membrane side can be measured.

In an aspect of the present disclosure, there is provided an ink jet print head including an actuator substrate having an ink flow path including a pressure chamber; a movable membrane forming layer including a movable membrane which is disposed on the pressure chamber and which defines a ceiling surface portion of the pressure chamber, piezoelectric element which is formed on the movable membrane and which includes a lower electrode, a piezoelectric film formed on the lower electrode and an upper electrode formed on the piezoelectric film, with the pressure chamber, the movable membrane and the upper electrode having a rectangular shape elongated in one direction in plan view as viewed from a direction normal to the movable membrane, the lower electrode including a main electrode section constituting the piezoelectric element and an extension section extending from the main electrode section along a surface of the movable membrane forming layer, and a dimension measuring pattern related to the pressure chamber. The dimension measuring pattern includes a dummy pressure chamber which is formed in the actuator substrate and which is identical in pattern to the pressure chamber. The lower electrode is formed with a cut-away portion in a region including at least part of both side edges of the dummy pressure chamber in the plan view.

According to this configuration, the lower electrode is formed with the cut-away portion in a region including at least part of both side edges of the dummy pressure chamber in plan view. Therefore, the positions of both side edges of the dummy pressure chamber on the movable membrane side can be detected from the side of the movable membrane forming layer by an optical measuring instrument. By this, the dimensions (for example, the width) of the dummy pressure chamber on the movable membrane side can be measured. Consequently, the dimensions of the pressure chamber on the movable membrane side can be measured.

In an embodiment of the present disclosure, the dummy pressure chamber is formed in the same step as a step of forming the pressure chamber.

In an embodiment of the present disclosure, the dimension measuring pattern further includes a dummy upper electrode for examining a relative positional deviation between the pressure chamber and the upper electrode, and the dummy upper electrode includes a dummy upper electrode which is formed on at least one of both lateral sides of the dummy pressure chamber in the plan view, on the movable membrane forming layer, and which is to be disposed spaced from the dummy pressure chamber by a predetermined first spacing.

In an embodiment of the present disclosure, the dummy upper electrode includes a first dummy upper electrode which is formed on the side of one side edge of the dummy pressure chamber and which is to be disposed spaced from the one side edge by the first spacing, in the plan view, and a second dummy upper electrode which is formed on the side of other side edge of the dummy pressure chamber and which is to be formed spaced from the other side edge by the first spacing, in the plan view.

In an embodiment of the present disclosure, the dummy upper electrode is formed in the same step as a step of forming upper electrodes of a plurality of the piezoelectric elements.

In an embodiment of the present disclosure, the ink jet print head further includes an upper wiring which is disposed on the movable membrane forming layer and which is connected to an upper electrode of each piezoelectric element, the dimension measuring pattern further includes a dummy wiring for examining a relative positional deviation between the pressure chamber and the upper wiring, and the dummy wiring includes a rectilinear dummy wiring which is formed on the side of at least one of both side edges of the dummy pressure chamber and which is to be disposed spaced from the side edge by a predetermined second spacing, in the plan view, on the movable membrane forming layer.

In an embodiment of the present disclosure, the dummy wiring includes a first dummy wiring which is formed on the side of one side edge of the dummy pressure chamber and which is to be disposed spaced from the one side edge by the second spacing, in the plan view, and a second dummy wiring which is formed on the side of other side edge of the dummy pressure chamber and which is to be disposed spaced from the other side edge by the second spacing.

In an embodiment of the present disclosure, the dummy wiring is formed in the same step as a step of forming the upper wiring.

In an embodiment of the present disclosure, the lower electrode is formed with a cut-away portion in a region including whole part of the dummy pressure chamber in the plan view.

In an embodiment of the present disclosure, the ink jet print head further includes a hydrogen barrier film covering at least whole region of side surfaces of the upper electrode and the piezoelectric film and an upper surface of the lower electrode, and an insulating film which is formed on the hydrogen barrier film and which is disposed between the hydrogen barrier film and the upper wiring, and the hydrogen barrier film and the insulating film are formed with a contact hole for exposing part of the upper electrode, an end portion of the upper wiring being connected to the upper electrode through the contact hole.

In an embodiment of the present disclosure, the ink jet print head further includes a passivation film which is formed on the insulating film and which coats the upper wiring.

In another aspect of the present disclosure, there is provided a first method of manufacturing an ink jet print head, including a first step of forming a movable membrane forming layer including a movable membrane forming region on an actuator substrate, a second step of forming a piezoelectric element in the movable membrane forming region, the piezoelectric element including a lower electrode, an upper electrode disposed on an opposite side of the lower electrode from the movable membrane forming layer, and a piezoelectric film interposed between the lower electrode and the upper electrode, and a third step of forming a pressure chamber opposed to the movable membrane forming region and forming a dummy pressure chamber, by etching the actuator substrate from below. The pressure chamber, the dummy pressure chamber, the movable membrane forming region and the upper electrode have a rectangular shape elongated in one direction in a plan view as viewed from a direction normal to the movable membrane.

The lower electrode includes a main electrode section constituting the piezoelectric element and an extension section extending from the main electrode section along a surface of the movable membrane forming layer. In the second step, the lower electrode is formed with a cut-away portion in a region including at least part of both side edges of the dummy pressure chamber in the plan view.

In a further aspect of the present disclosure, there is provided a second method of manufacturing an ink jet print head, including a first step of forming a movable membrane forming layer including a movable membrane forming region on an actuator substrate, a second step of forming a piezoelectric element on the movable membrane forming region, the piezoelectric element including a lower electrode, an upper electrode disposed on an opposite side of the lower electrode from the movable membrane forming layer, and a piezoelectric film interposed between the lower electrode and the upper electrode, and forming a dummy piezoelectric element including a dummy upper electrode on the movable membrane forming layer, and a third step of forming a pressure chamber opposed to the movable membrane forming region and forming a dummy pressure chamber, by etching the actuator substrate from below. The pressure chamber, the dummy pressure chamber, the movable membrane forming region, the upper electrode and the dummy upper electrode have a rectangular shape elongated in one direction in a plan view as viewed from a direction normal to the movable membrane. The dummy upper electrode includes a dummy upper electrode which is formed on at least one of both lateral sides of the dummy pressure chamber in the plan view and which is to be disposed spaced from the dummy pressure chamber by a predetermined first spacing. The lower electrode includes a main electrode section constituting the piezoelectric element and an extension section extending from the main electrode section along a surface of the movable membrane forming layer. In the second step, the lower electrode is formed with a cut-away portion in a region including at least part of both side edges of the dummy pressure chamber in the plan view.

In an embodiment of the present disclosure, the dummy upper electrode includes a first dummy upper electrode which is formed on the side of one side edge of the dummy pressure chamber and which is to be disposed spaced from the one side edge by the first spacing, in the plan view, and a second dummy upper electrode which is formed on the side of other side edge of the dummy pressure chamber and which is to be formed spaced from the other side edge by the first spacing, in the plan view.

In an embodiment of the present disclosure, the second method of manufacturing an ink jet print head further includes a step of forming an upper wiring connected to an upper electrode of each piezoelectric element and a dummy wiring, between the second step and the third step, in which the dummy wiring includes a rectilinear dummy wiring which is formed on the side of at least one of both side edges of the dummy pressure chamber and which is to be disposed spaced from the side edge by a predetermined second spacing, in the plan view, on the movable membrane forming layer.

In an embodiment of the present disclosure, the dummy wiring includes a first dummy wiring which is formed on the side of one side edge of the dummy pressure chamber and which is to be disposed spaced from the one side edge by the second spacing, in the plan view, and a second dummy wiring which is formed on the side of other side edge of the dummy pressure chamber and which is to be disposed spaced from the other side edge by the second spacing.

BRIEF DESCRIPTION OF THE DRAWINGS

FIG. 13D is a sectional view depicting a step next to FIG. 13C;

FIG. 14D is a sectional view depicting a step next to FIG. 14C;

DETAILED DESCRIPTION OF THE PREFERRED EMBODIMENT

An embodiment of the present disclosure will be described in detail below, referring to the attached drawings.

Figure 1:
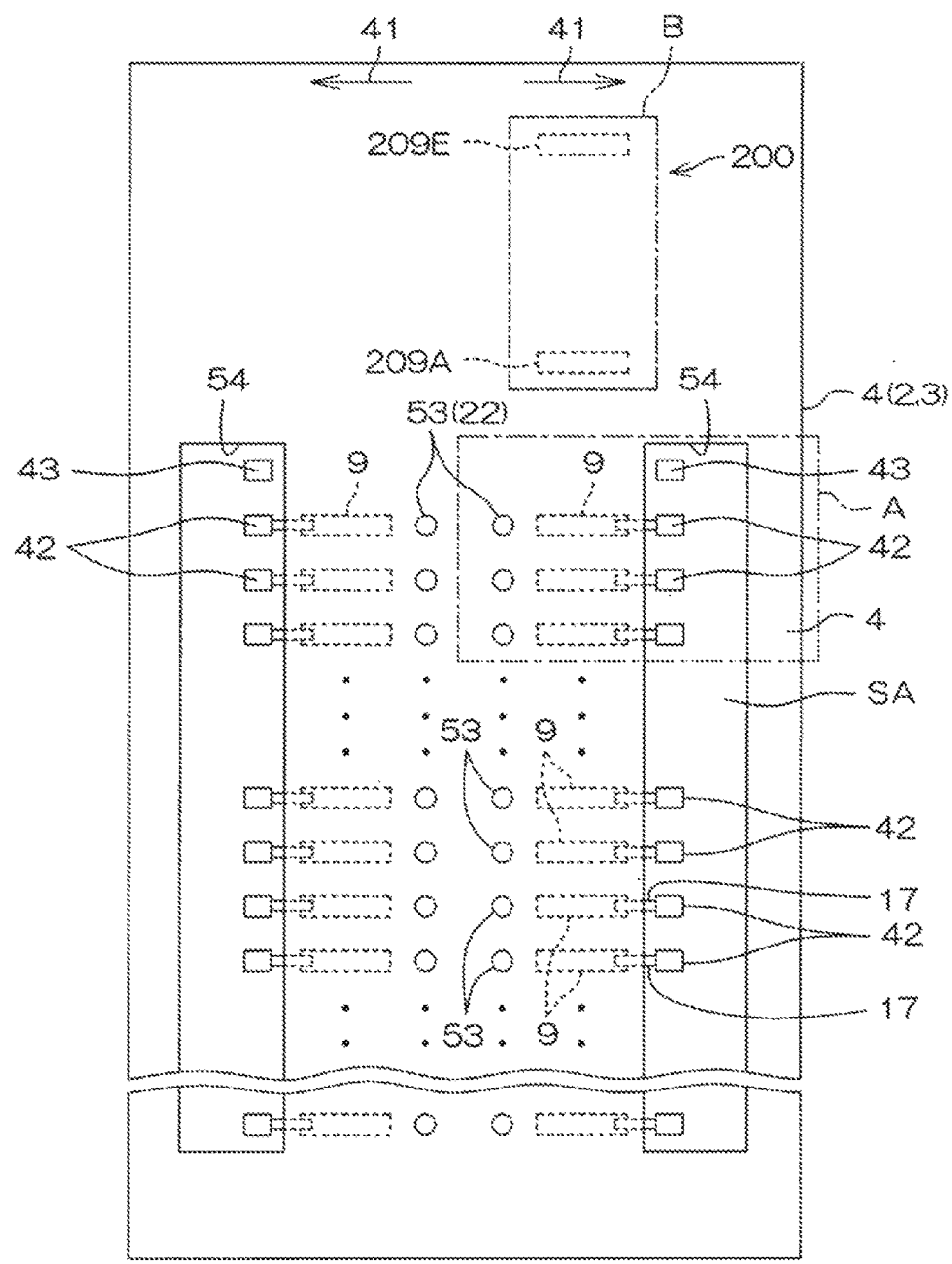
FIG. 1 is an illustrational plan view for explaining the configuration of an ink jet print head according to an embodiment of the present disclosure.
Figure 2:
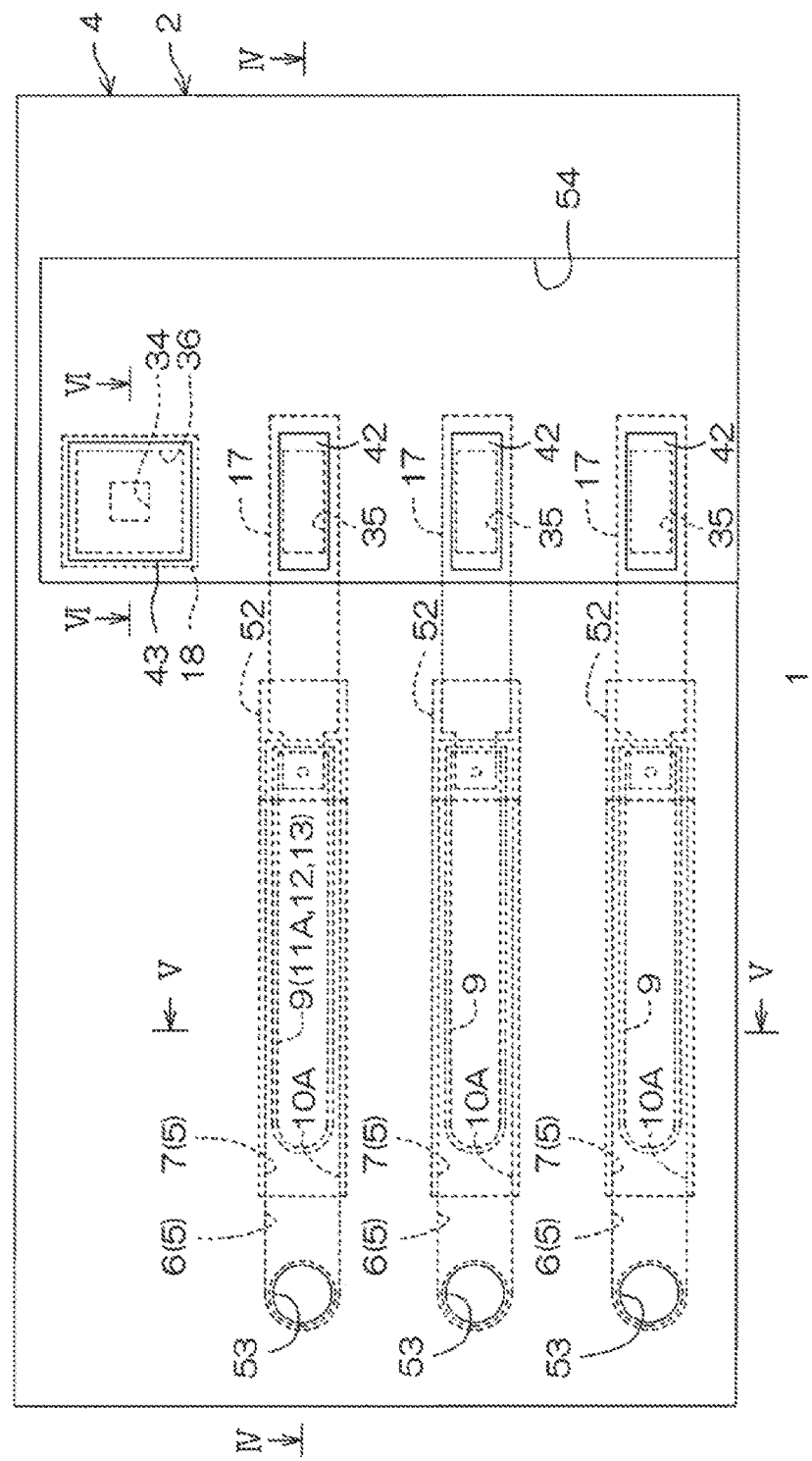
FIG. 2 is an illustrational partial enlarged plan view depicting a part A of FIG. 1 in an enlarged form, and is a plan view including a protective substrate.
Figure 3:
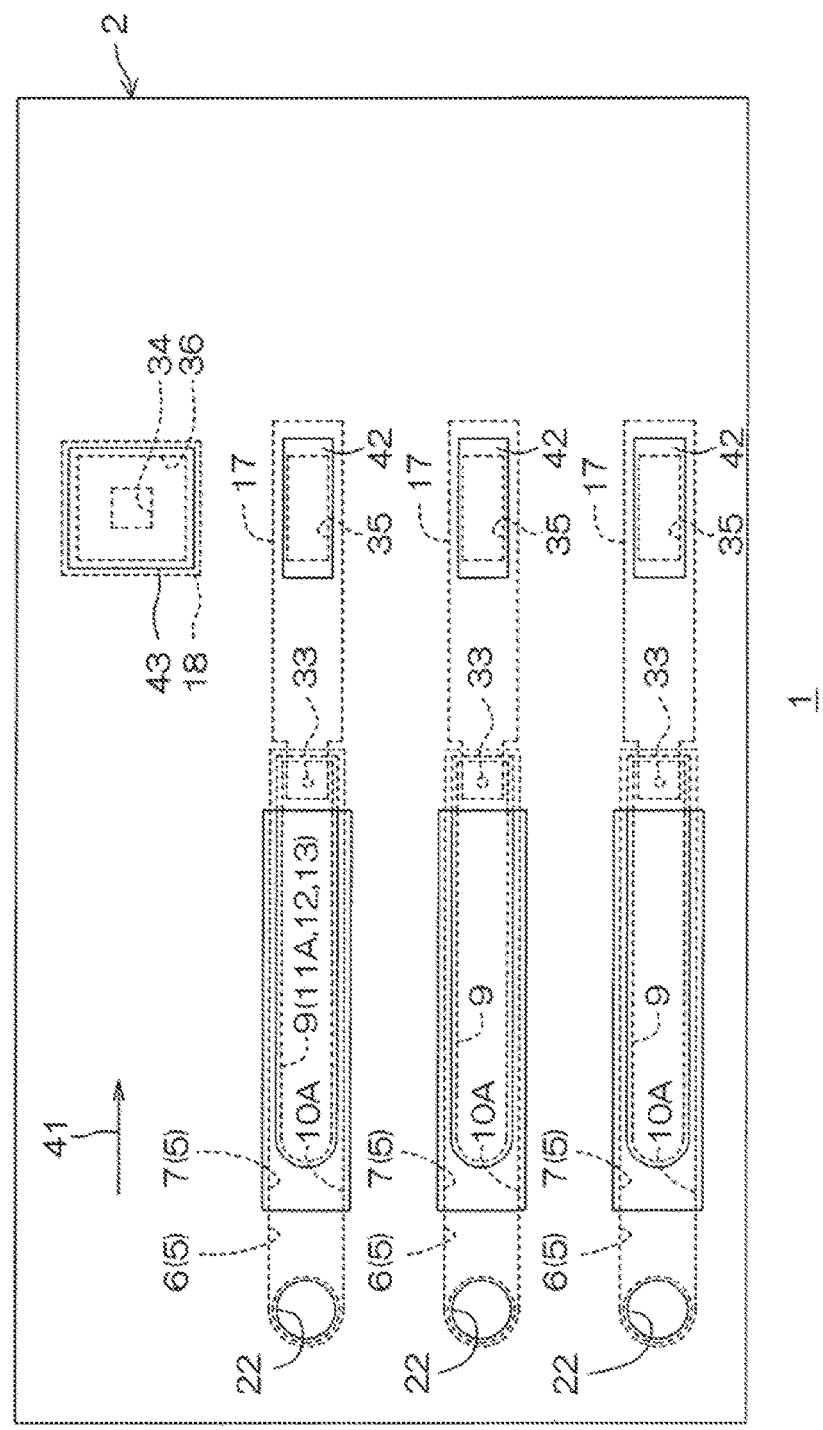
FIG. 3 is an illustrational partial enlarged plan view depicting the part A of FIG. 1 in an enlarged form, and is a plan view in which the protective substrate is omitted.
Figure 4:
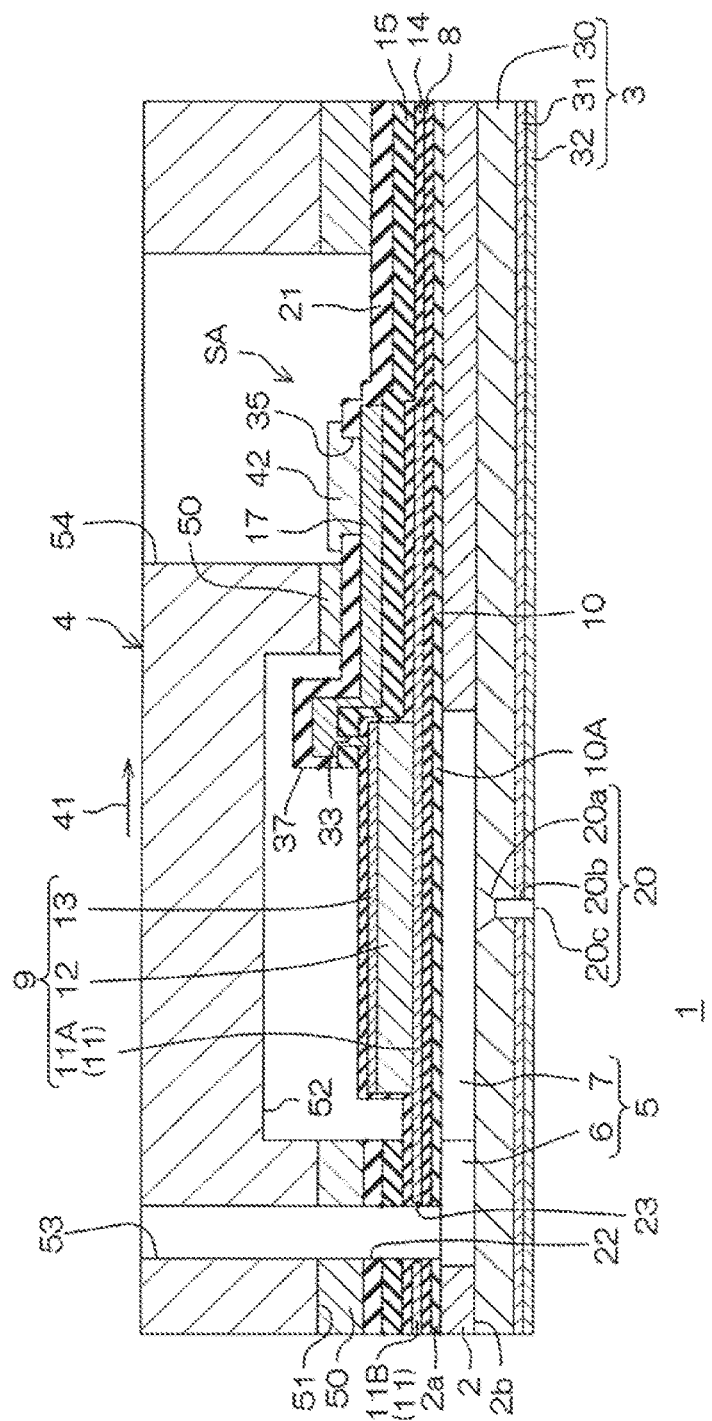
FIG. 4 is an illustrational sectional view taken along line IV-IV of FIG. 2.
Figure 5:
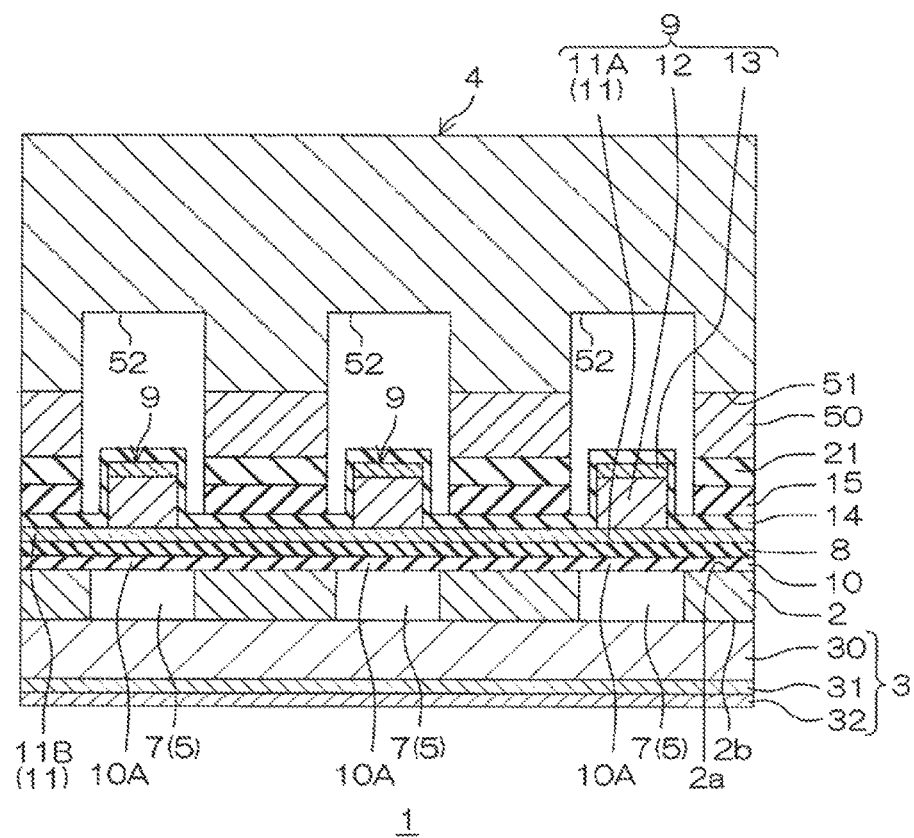
FIG. 5 is an illustrational sectional view taken along line V-V of FIG. 2.
Figure 6:
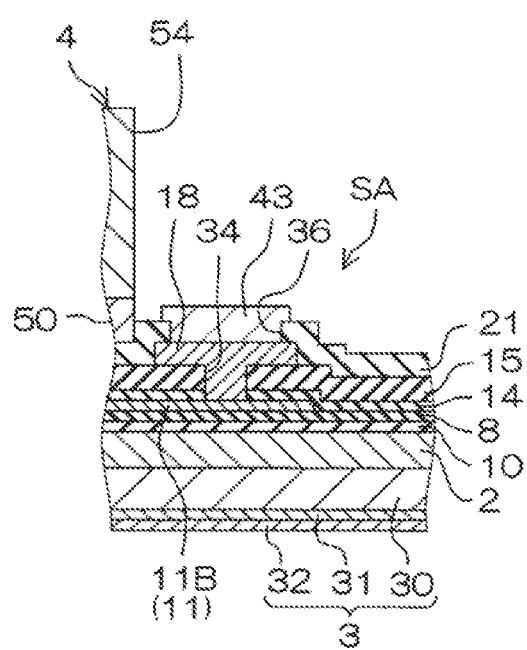
FIG. 6 is an illustrational sectional view taken along line VI-VI of FIG. 2.

FIG. 1 is an illustrational plan view for explaining the configuration of an ink jet print head according to an embodiment of the present disclosure. FIG. 2 is an illustrational partial enlarged plan view depicting a part A of FIG. 1 in an enlarged form, and is a plan view including a protective substrate. FIG. 3 is an illustrational partial enlarged plan view depicting the part A of FIG. 1 in an enlarged form, and is a plan view in which the protective substrate is omitted. FIG. 4 is an illustrational sectional view taken along line IV-IV of FIG. 2. FIG. 5 is an illustrational sectional view taken along line V-V of FIG. 2. FIG. 6 is an illustrational sectional view taken along line VI-VI of FIG. 2.

Referring to FIG. 4, the configuration of an ink jet print head 1 will be described generally.

The ink jet print head 1 includes: an actuator substrate assembly SA including an actuator substrate 2 and piezoelectric elements 9; a nozzle substrate 3; and a protective substrate 4. Hereinafter, the actuator substrate assembly SA will be referred to as substrate assembly SA.

A movable membrane forming layer 10 is layered on a surface 2a of the actuator substrate 2. The actuator substrate 2 is formed with ink flow paths (ink reservoirs) 5. In this embodiment, the ink flow path 5 is formed to penetrate the actuator substrate 2. The ink flow path 5 is formed to extend in an elongated form along an ink flow direction 41 indicated by an arrow in FIG. 4. The ink flow path 5 includes an ink inflow section 6 at an upstream side end portion (a left end portion in FIG. 4) with respect to the ink flow direction 41, and a pressure chamber 7 communicating with the ink inflow section 6. In FIG. 4, the boundary between the ink inflow section 6 and the pressure chamber 7 is indicated by an alternate long and two short dashes line.

The nozzle substrate 3 includes, for example, a silicon (Si) substrate (main substrate) 30, a silicon oxide (SiO2) film 31 formed on a surface (back side) of the silicon substrate 30 on the side opposite to the pressure chamber 7, and a water-repellent film 32 formed on a surface of the silicon oxide film 31 on the side opposite to the silicon substrate 30. In this embodiment, the water-repellent film 32 includes an organic film made of a fluoropolymer or the like. In this embodiment, the thickness of the silicon substrate 30 is approximately 40 μm, the thickness of the silicon oxide film 31 is approximately 0.1 μm, and the thickness of the water-repellent film 32 is approximately 0.1 μm. The nozzle substrate 3 is laminated on a back side 2b of the actuator substrate 2, in a state in which the surface on the silicon substrate 30 side faces the back side 2b of the actuator substrate 2. The nozzle substrate 3 defines the ink flow path 5, together with the actuator substrate 2 and the movable membrane forming layer 10. Specifically, the nozzle substrate 3 defines a bottom surface portion of the ink flow path 5.

The nozzle substrate 3 is formed with a nozzle hole 20. The nozzle hole 20 includes a recess 20a fronting on the pressure chamber 7, and an ink discharge passage 20b formed in a bottom surface of the recess 20a. The ink discharge passage 20b penetrates a bottom wall of the recess 20a, and has an ink discharge port 20c on the side opposite to the pressure chamber 7. Therefore, when a volume change occurs in the pressure chamber 7, the ink reserved in the pressure chamber 7 is discharged from the ink discharge port 20c by passing through the ink discharge passage 20b.

In this embodiment, the recess 20a is formed in the shape of a truncated cone whose cross-section is gradually decreased from the surface of the silicon substrate 30 toward the silicon oxide film 31 side. The ink discharge passage 20b includes a straight hole having a circular cross-section. In this embodiment, the recess 20a is formed up to an intermediate position of the thickness of the silicon substrate 30, and the ink discharge passage 20b includes a portion formed in the silicon substrate 30 and portions formed in the silicon oxide film 31 and the water-repellent film 32.

A portion of the movable membrane forming layer 10 corresponding to a ceiling wall of the pressure chamber 7 constitutes a movable membrane 10A. The movable membrane 10A (movable membrane forming layer 10) includes, for example, a silicon oxide (SiO2) film formed on the actuator substrate 2. The movable membrane 10A (movable membrane forming layer 10) may include a stacked film of a silicon (Si) film formed on the actuator substrate 2, a silicon oxide (SiO2) film formed on the silicon film, and a silicon nitride (SiN) film formed on the silicon oxide film, for example. The movable membrane 10A herein means a ceiling wall portion of the movable membrane forming layer 10 that defines a ceiling surface portion of the pressure chamber 7. Therefore, of the movable membrane forming layer 10, other portions than the ceiling wall portion of the pressure chamber 7 do not constitute the movable membrane 10A.

The thickness of the movable membrane 10A is, for example, 0.4 to 2 μm. In the case where the movable membrane 10A includes a silicon oxide film, the thickness of the silicon oxide film may be approximately 1.2 μm. In the case where the movable membrane 10A includes a stacked film of a silicon film, a silicon oxide film and a silicon nitride film, the thicknesses of the silicon film, the silicon oxide film and the silicon nitride film may each be approximately 0.4 μm.

The pressure chamber 7 is defined by the movable membrane 10A, the actuator substrate 2 and the nozzle substrate 3, and, in this embodiment, it is formed in a substantially rectangular parallelepiped shape. The length of the pressure chamber 7 may be, for example, approximately 800 μm, and the width of the pressure chamber 7 may be approximately 55 μm. The ink inflow section 6 communicates with an end portion in regard of the longitudinal direction of the pressure chamber 7.

A metal barrier film 8 is formed on a surface of the movable membrane forming layer 10. The metal barrier film 8 is formed, for example, of Al2O3 (alumina). The thickness of the metal barrier film 8 is approximately 50 to 100 nm. The piezoelectric element 9 is disposed on a surface of the metal barrier film 8, at a position above the movable membrane 10A. The piezoelectric element 9 includes a lower electrode 11 formed on the metal barrier film 8, a piezoelectric film 12 formed on the lower electrode 11, and an upper electrode 13 formed on the piezoelectric film 12. In other words, the piezoelectric element 9 is configured by sandwiching the piezoelectric film 12 by the upper electrode 13 and the lower electrode 11 from the upper and lower sides.

The upper electrode 13 may be a single film of platinum (Pt), or may have a stacked structure in which, for example, a conductive oxide film (e.g., IrO2 (iridium oxide) film) and a metallic film (e.g., Ir (iridium) film) are stacked. The thickness of the upper electrode 13 may be, for example, approximately 0.2 μm.

As the piezoelectric film 12, there can be applied, for example, a PZT (PbZrxTi1−xO3: lead zirconate titanate) film formed by a sol-gel method or a sputtering method. Such a piezoelectric film 12 is formed of a sintered body of metallic oxide crystals. The piezoelectric film 12 is formed in the same shape as the upper electrode 13 in plan view. The thickness of the piezoelectric film 12 is approximately 1 μm. The overall thickness of the movable membrane 10A is preferably comparable to the thickness of the piezoelectric film 12, or approximately ⅔ times the thickness of the piezoelectric film 12. The aforementioned metal barrier film 8 mainly functions to prevent metallic elements (Pb, Zr, and Ti in the case where the piezoelectric film 12 is PZT) from coming out of the piezoelectric film 12, to maintain good piezoelectric characteristics of the piezoelectric film 12, and to prevent the metals from diffusing into the movable membrane 10A at the time of forming the piezoelectric film 12. The metal barrier film 8 also has a function to prevent characteristics of the piezoelectric film 12 from being deteriorated due to hydrogen reduction.

The lower electrode 11 has a two-layer structure in which, for example, a Ti (titanium) film and a Pt (platinum) film are stacked in this order from the metal barrier film 8 side. Other than this structure, the lower electrode 11 may be formed of a single film of an Au (gold) film, a Cr (chromium) layer, a Ni (nickel) layer or the like. The lower electrode 11 has a main electrode section 11A in contact with a lower surface of the piezoelectric film 12, and an extension section 11B extending to a region outside of the piezoelectric film 12. The thickness of the lower electrode 11 may be, for example, approximately 0.2 μm.

A hydrogen barrier film 14 is formed on the piezoelectric element 9, on the extension section 11B of the lower electrode 11 and on the metal barrier film 8. The hydrogen barrier film 14 is formed, for example, of Al2O3 (alumina). The thickness of the hydrogen barrier film 14 is approximately 50 to 100 nm. The hydrogen barrier film 14 is provided for preventing characteristics of the piezoelectric film 12 from being deteriorated due to hydrogen reduction.

An insulating film 15 is stacked on the hydrogen barrier film 14. The insulating film 15 is formed, for example, of SiO2, low-hydrogen SiN, or the like. The thickness of the insulating film 15 is approximately 500 nm. Upper wirings 17, lower wirings 18 (see FIGS. 2 and 6) and dummy wirings 217B and 217D (see FIGS. 10 and 11) are formed on the insulating film 15. These wirings may be formed of a metallic material containing Al (aluminum). The thicknesses of these wirings may be, for example, approximately 1,000 nm (1 μm).

An end portion of the upper wiring 17 is disposed on the upper side of an end portion (a downstream side end portion in regard of the ink flow direction 41) of the upper electrode 13. Between the upper wiring 17 and the upper electrode 13, a contact hole 33 is formed which continuously penetrates the hydrogen barrier film 14 and the insulating film 15. The end portion of the upper wiring 17 extends into the contact hole 33, and is connected to the upper electrode 13 in the contact hole 33. The upper wiring 17 extends from the upper side of the upper electrode 13 to the outside of the pressure chamber 7 by crossing an outer edge of the pressure chamber 7. The lower wirings 18 and the dummy wirings 2176 and 217D will be described later.

On the insulating film 15, a passivation film 21 is formed which covers the upper wirings 17, the lower wirings 18, the dummy wirings 217B and 217D and the insulating film 15. The passivation film 21 is formed, for example, of SiN (silicon nitride). The thickness of the passivation film 21 may be, for example, approximately 800 nm.

The passivation film 21 is formed with pad openings 35 through which to expose part of the upper wirings 17. The pad openings 35 are formed in a region outside of the pressure chamber 7; for example, they are each formed at a tip portion (an end portion on the side opposite to a contact portion for contact with the upper electrode 13) of the upper wiring 17. On the passivation film 21, there are formed upper electrode pads 42 which cover the pad openings 35. The upper electrode pads 42 each extend into the pad opening 35, and are connected to the upper wiring 17 in the pad opening 35. While the lower wiring 18 is also provided with a lower electrode pad 43 (see FIGS. 2 and 6), the lower electrode pad 43 will be described later.

At a position corresponding to an end portion of the ink flow path 5 on the ink inflow section 6 side, an ink supplying through-hole 22 is formed which penetrates the passivation film 21, the insulating film 15, the hydrogen barrier film 14, the lower electrode 11, the metal barrier film 8 and the movable membrane forming layer 10. The lower electrode 11 is formed with a through-hole 23 which includes the ink supplying through-hole 22 and is larger than the ink supplying through-hole 22. The hydrogen barrier film 14 extends into a gap between the through-hole 23 of the lower electrode 11 and the ink supplying through-hole 22. The ink supplying through-hole 22 communicates with the ink inflow section 6.

The protective substrate 4 includes, for example, of a silicon substrate. The protective substrate 4 is disposed on the substrate assembly SA in such a manner as to cover the piezoelectric elements 9. The protective substrate 4 is bonded to the substrate assembly SA through an adhesive 50. The protective substrate 4 has accommodating recesses 52 formed in an opposed surface 51 which is opposed to the substrate assembly SA. The piezoelectric elements 9 are accommodated in the accommodating recesses 52. Further, the protective substrate 4 is formed with ink supply passages 53 communicating with the ink supplying through-holes 22, and with openings 54 through which to expose the pads 42 and 43. The ink supply passages 53 and the openings 54 penetrate the protective substrate 4. An ink tank (not depicted) storing ink therein is disposed on the protective substrate 4.

The piezoelectric element 9 is disposed at such a position as to face the pressure chamber 7, with the movable membrane 10A and the metal barrier film 8 interposed therebetween. In other words, the piezoelectric element 9 is formed to make contact with that surface of the metal barrier film 8 which is on the side opposite to the pressure chamber 7. The ink is supplied from the ink tank into the pressure chambers 7 through the ink supply passages 53, the ink supplying through-holes 22 and the ink inflow sections 6, whereby the pressure chambers 7 are filled with the ink. The movable membrane 10A defines the ceiling surface portion of the pressure chamber 7, and fronts on the pressure chamber 7. The movable membrane 10A is supported by that portion of the actuator substrate 2 which surrounds the pressure chamber 7, and the movable membrane 10A has flexibility such as to be deformable in the direction of facing the pressure chamber 7 (in other words, in the thickness direction of the movable membrane 10A).

The lower wirings 18 (see FIGS. 2 and 6) and the upper wirings 17 are connected to a driving circuit (not depicted). Specifically, the upper electrode pad 42 and the driving circuit are connected to each other through a connection metal member (not depicted). The lower electrode pad 43 (see FIGS. 2 and 6) and the driving circuit are connected to each other through a connection metal member (not depicted). When a driving voltage is impressed on the piezoelectric element 9 from the driving circuit, the piezoelectric film 12 is deformed by an inverse piezoelectric effect. As a result, the movable membrane 10A is deformed together with the piezoelectric element 9, whereby the volume of the pressure chamber 7 is changed, and the ink in the pressure chamber 7 is pressurized. The pressurized ink is passed through the ink discharge passage 20b, to be discharged as a minute droplet from the ink discharge port 20c.

Referring to FIGS. 1 to 6, the configuration of the ink jet print head 1 will be described in detail below. In the following description, the left side in FIG. 1 will be referred to as the "left (side)," the right side in FIG. 1 will be referred to as the "right (side)," the lower side in FIG. 1 will be referred to as the "front (side)," and the upper side in FIG. 1 will be referred to as the "rear (side)."

As illustrated in FIG. 1, the plan-view shape of the ink jet print head 1 is a rectangular shape elongated in the front-rear direction. In this embodiment, the plan-view shapes and sizes of the actuator substrate 2, the protective substrate 4 and the nozzle substrate 3 are substantially the same as the plan-view shape and the size of the ink jet print head 1.

On the actuator substrate 2, a plurality of columns of piezoelectric elements 9 (hereinafter referred to as the "piezoelectric element columns") are provided at intervals in the left-right direction, each column having a plurality of piezoelectric elements 9 arranged in stripe form at intervals in the front-rear direction, in plan view. In this embodiment, for convenience of explanation, two such piezoelectric element columns are provided. In this embodiment, a dimension measuring pattern 200 for performing at least measurement of the dimensions (size) of the pressure chamber 7 is formed on the rear side (the upper side in FIG. 1) of the piezoelectric element column on the right side. The dimension measuring pattern 200 will be described later.

As depicted in FIGS. 2 and 3, the actuator substrate 2 is formed with the ink flow paths 5 (the pressure chambers 7), one for each piezoelectric element 9. Therefore, the actuator substrate 2 is provided with two ink flow path columns (pressure chamber columns) at an interval in the left-right direction, each ink flow path column including a plurality of the ink flow paths 5 (pressure chambers 7) arranged in stripe form at intervals in the front-rear direction, in plan view.

The pattern of the ink flow path column corresponding to the piezoelectric element column on the left side in FIG. 1 and the pattern of the ink flow path column corresponding to the piezoelectric element column on the right side are in left-right symmetry about a line segment connecting the centers between the columns. Therefore, in the ink flow path 5 included in the ink flow path column on the left side, the ink inflow section 6 is located on the right side of the pressure chamber 7; on the other hand, in the ink flow path 5 included in the ink flow path column on the right side, the ink inflow section 6 is located on the left side of the pressure chamber 7. Accordingly, the ink flow direction 41 in the ink flow path column on the left side and the ink flow direction 41 in the ink flow path column on the right side are reverse to each other.

The ink supplying through-holes 22 are provided, one for each of the plurality of ink flow paths 5 of each ink flow path column. The ink supplying through-hole 22 is disposed on the ink inflow section 6. Therefore, the ink supplying through-hole 22 for the ink flow path 5 included in the ink flow path column on the left side is disposed on a right end portion of the ink flow path 5, whereas the ink supplying through-hole 22 for the ink flow path 5 included in the ink flow path column on the right side is disposed on a left end portion of the ink flow path 5.

In each ink flow path column, the plurality of ink flow paths 5 are formed at minute regular intervals (e.g., approximately 30 to 350 μm) in the width direction thereof. Each ink flow path 5 extends in an elongate form along the ink flow direction 41. The ink flow path 5 includes the ink inflow section 6 communicating with the ink supplying through-hole 22, and the pressure chamber 7 communicating with the ink inflow section 6. The pressure chamber 7 has a rectangular shape elongated along the ink flow direction 41. In short, a ceiling surface portion of the pressure chamber 7 has two side edges along the ink flow direction 41, and two end edges along a direction orthogonal to the ink flow direction 41. The ink inflow section 6 has substantially the same width as that of the pressure chamber 7 in plan view. An inner surface of that end portion of the ink inflow section 6 which is on the side opposite to the pressure chamber 7 is formed in a semicircular shape in plan view. The ink supplying through-hole 22 is circular in shape in plan view (see particularly FIG. 3).

The piezoelectric element 9 has a rectangular shape elongated in the longitudinal direction of the pressure chamber 7 (the movable membrane 10A). The length in the longitudinal direction of the piezoelectric element 9 is shorter than the length in the longitudinal direction of the pressure chamber 7 (the movable membrane 10A). As depicted in FIG. 3, both end edges along the transverse direction of the piezoelectric element 9 are disposed on the inner side of, and spaced by a predetermined spacing from, the corresponding end edges of the movable membrane 10A. In addition, the width in the transverse direction of the piezoelectric element 9 is narrower than the width in the transverse direction of the movable membrane 10A. Both side edges along the longitudinal direction of the piezoelectric element 9 are disposed on the inner side of, and spaced by a predetermined spacing from, the corresponding side edges of the movable membrane 10A.

The lower electrode 11 is formed to spread over substantially the whole region of a surface of the movable membrane forming layer 10, exclusive of a peripheral edge portion of the surface of the movable membrane forming layer 10. The lower electrode 11 is a common electrode which is shared by a plurality of the piezoelectric elements 9. The lower electrode 11 includes the main electrode section 11A which is rectangular in shape in plan view and which constitutes the piezoelectric element 9, and the extension section 11B which is led out from the main electrode section 11A in a direction along the surface of the movable membrane forming layer 10 and which extends to outside of a peripheral edge of the ceiling surface portion of the pressure chamber 7.

The length in the longitudinal direction of the main electrode section 11A is shorter than the length in the longitudinal direction of the movable membrane 10A. Both end edges of the main electrode section 11A are disposed on the inner side of, and spaced by a predetermined spacing from, the corresponding end edges of the movable membrane 10A. In addition, the width in the transverse direction of the main electrode section 11A is narrower than the width in the transverse direction of the movable membrane 10A. Both side edges of the main electrode section 11A are disposed on the inner side of, and spaced by a predetermined spacing from, the corresponding side edges of the movable membrane 10A. The extension section 11B is a region obtained by excluding the main electrode section 11A from the whole region of the lower electrode 11.

The upper electrode 13 is formed in a rectangular shape which is the same pattern as that of the main electrode section 11A of the lower electrode 11, in plan view. Specifically, the length in the longitudinal direction of the upper electrode 13 is shorter than the length in the longitudinal direction of the movable membrane 10A. Both end edges of the upper electrode 13 are disposed on the inner side of, and spaced by a predetermined spacing from, the corresponding end edges of the movable membrane 10A. In addition, the width in the transverse direction of the upper electrode 13 is narrower than the width in the transverse direction of the movable membrane 10A. Both side edges of the upper electrode 13 are disposed on the inner side of, and spaced by a predetermined spacing from, the corresponding side edges of the movable membrane 10A.

The piezoelectric film 12 is formed in a rectangular shape which is the same pattern as that of the upper electrode 13, in plan view. Specifically, the length in the longitudinal direction of the piezoelectric film 12 is shorter than the length in the longitudinal direction of the movable membrane 10A. Both end edges of the piezoelectric film 12 are disposed on the inner side of, and spaced by a predetermined spacing from, the corresponding end edges of the movable membrane 10A. Besides, the width in the transverse direction of the piezoelectric film 12 is narrower than the width in the transverse direction of the movable membrane 10A. Both side edges of the piezoelectric film 12 are disposed on the inner side of, and spaced by a predetermined spacing from, the corresponding side edges of the movable membrane 10A. A lower surface of the piezoelectric film 12 is in contact with an upper surface of the main electrode section 11A of the lower electrode 11, and an upper surface of the piezoelectric film 12 is in contact with a lower surface of the upper electrode 13.

The upper wiring 17 extends from an upper surface of an end portion (an end portion on the downstream side in regard of the ink flow direction 41) of the piezoelectric element 9 along an end surface of the piezoelectric element 9 continuous with the upper surface, and, further, extends in a direction along the ink flow direction 41 along a surface of the extension section 11B of the lower electrode 11. A tip portion of the upper wiring 17 is disposed inside the opening 54 of the protective substrate 4.

The passivation film 21 is formed with the upper electrode pad openings 35 through which to expose central portions of tip portion surfaces of the upper wirings 17. On the passivation film 21, upper electrode pads 42 are provided such as to cover the upper electrode pad openings 35. The upper electrode pad 42 is connected to the upper wiring 17 in the upper electrode pad opening 35. A plurality of upper electrode pads 42 corresponding to the plurality of piezoelectric elements 9 in the piezoelectric element column on the left side are disposed in the state of being aligned in a column in the front-rear direction on the left side of the left-side piezoelectric element column, in plan view, as depicted in FIG. 1. In addition, a plurality of upper electrode pads 42 corresponding to the plurality of piezoelectric elements 9 in the piezoelectric element column on the right side are disposed in the state of being aligned in a column in the front-rear direction on the right side of the right-side piezoelectric element column, in plan view.

Referring to FIGS. 1, 2, 3 and 6, the lower wiring 18 is disposed at a position at the rear of the left-side upper electrode pad column and at a position at the rear of the right-side upper electrode pad column, in plan view. The lower wiring 18 is tetragonal in shape in plan view. The extension section 11B of the lower electrode 11 is present under the lower wiring 18. Between the lower wiring 18 and the extension section 11B of the lower electrode 11, there is formed a contact hole 34 which continuously penetrates the hydrogen barrier film 14 and the insulating film 15. The lower wiring 18 extends into the contact hole 34, and is connected to the extension section 11B of the lower electrode 11 in the contact hole 34.

The passivation film 21 is formed with a pad opening 36 through which to expose a central portion of the surface of the lower wiring 18. On the passivation film 21, there is formed a lower electrode pad 43 which covers the pad opening 36. The lower electrode pad 43 extends into the pad opening 36, and is connected to the lower wiring 18 in the pad opening 36.

As illustrated in FIGS. 1, 2 and 4, the protective substrate 4 is formed with a plurality of ink supply passages 53 (hereinafter sometimes referred to as the "first ink supply passages 53") communicating with the plurality of ink supplying through-holes 22 for the ink flow path column on the left side, and formed with a plurality of ink supply passages 53 (hereinafter sometimes referred to as the "second ink supply passages 53") communicating with the plurality of ink supplying through-holes 22 for the ink flow path column on the right side. The first ink supply passages 53 are disposed in a column at intervals in the front-rear direction, at positions deviated to the left side from the center of width of the protective substrate 4, in plan view. The second ink supply passages 53 are disposed in a column at intervals in the front-rear direction, at positions deviated to the right side from the center of width of the protective substrate 4, in plan view. The ink supply passages 53 have a circular shape which is the same pattern as that of the ink supplying through-holes 22 on the actuator substrate 2 side in plan view. The ink supply passages 53 are in register with the ink supplying through-holes 22 in plan view.

In addition, the protective substrate 4 is formed with the opening 54 through which to expose all the upper electrode pads 42, corresponding to the piezoelectric element column on the left side, and the lower electrode pads 43 on the left side. Besides, the protective substrate 4 is formed with the opening 54 through which to expose all the upper electrode pads 42, corresponding to the piezoelectric element column on the right side, and the lower electrode pad 43 on the right side. These openings 54 have a rectangular shape elongated in the front-rear direction, in plan view.

Figure 9:
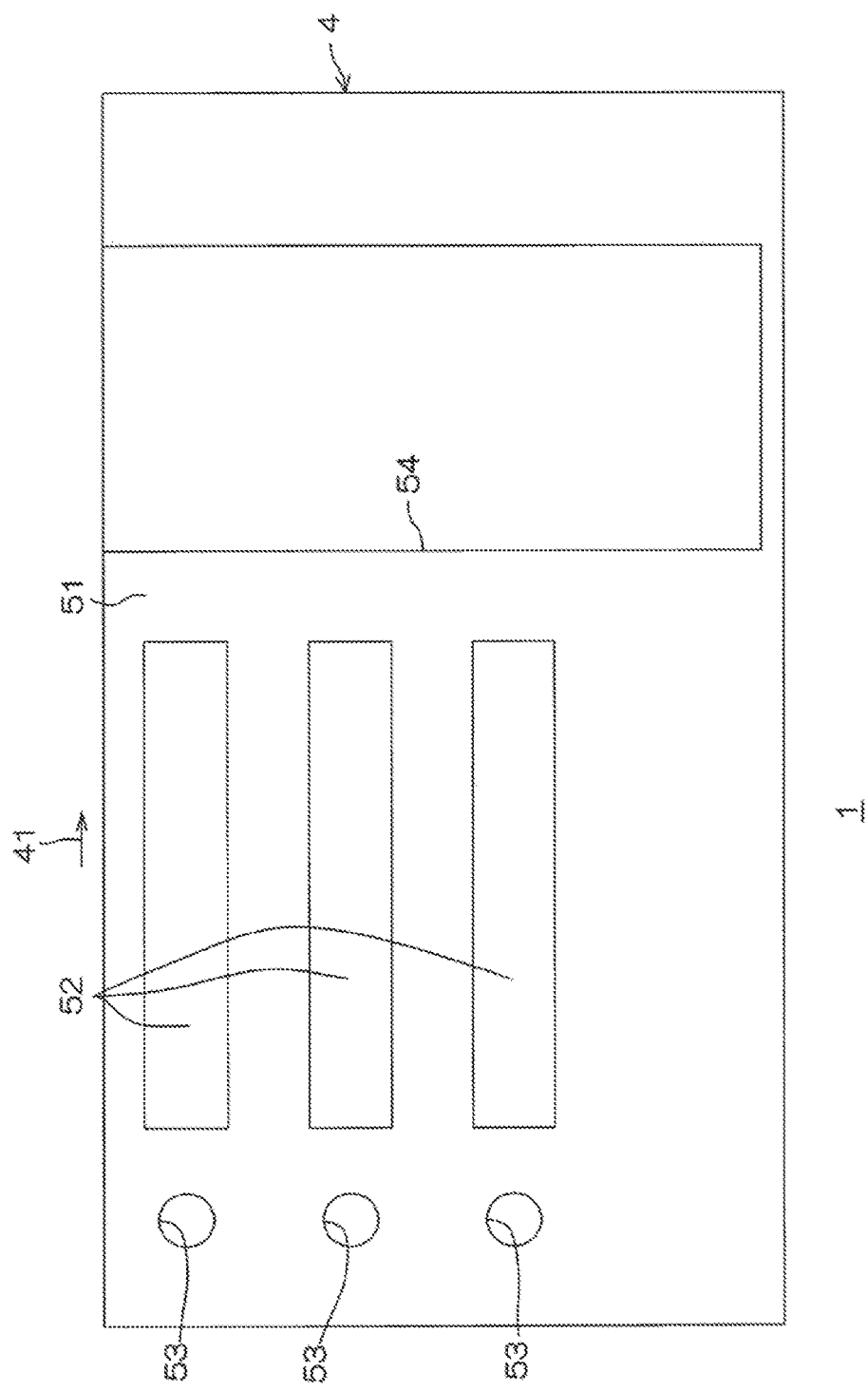
FIG. 9 is a bottom view of a region depicted in FIG. 2 of the protective substrate.

FIG. 9 is a bottom view of the region depicted in FIG. 2 of the protective substrate.

As depicted in FIGS. 4, 5 and 9, the opposed surface 51 of the protective substrate 4 is formed with the accommodating recesses 52, at positions for facing the piezoelectric elements 9 in each piezoelectric element column. In relation to each accommodating recess 52, the ink supply passage 53 is disposed on the upstream side in regard of the ink flow direction 41, and the opening 54 is disposed on the downstream side. Each accommodating recess 52 is formed in a rectangular shape slightly larger than the pattern of the upper electrode 13 of the corresponding piezoelectric element 9, in plan view. In addition, in each accommodating recess 52, the corresponding piezoelectric element 9 is accommodated.

Figure 7:
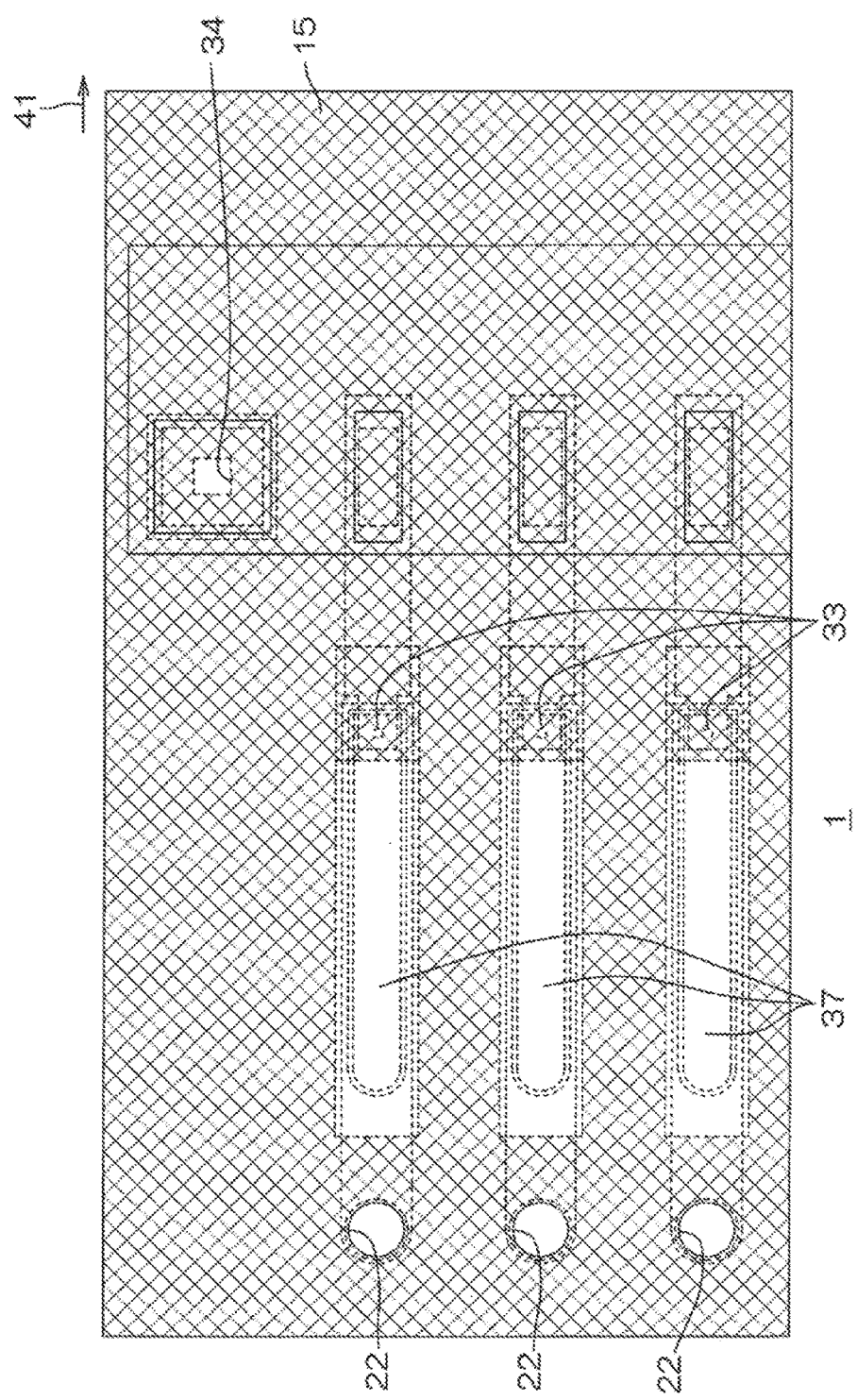
FIG. 7 is an illustrational plan view depicting a pattern example of an insulating film of the ink jet print head, and is a plan view corresponding to FIG. 2.
Figure 8:
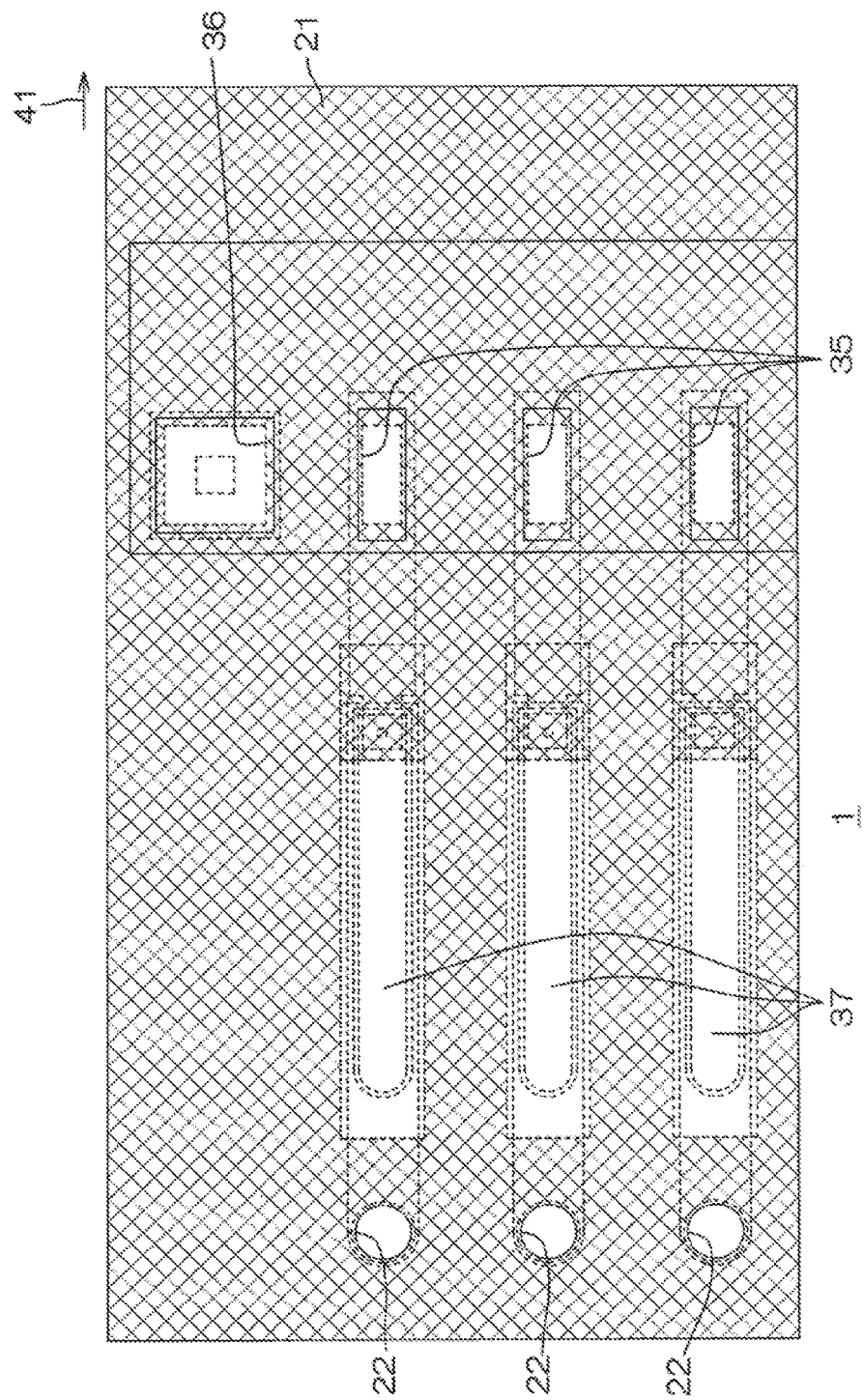
FIG. 8 is an illustrational plan view depicting a pattern example of a passivation film of the ink jet print head, and is a plan view corresponding to FIG. 2.

FIG. 7 is an illustrational plan view depicting a pattern example of the insulating film of the ink jet print head. FIG. 8 is an illustrational plan view depicting a pattern example of the passivation film of the ink jet print head.

In this embodiment, the insulating film 15 and the passivation film 21 are formed on the actuator substrate 2, over substantially the whole area of the region outside of the accommodating recesses 52 of the protective substrate 4 in plan view. It is to be noted that in this region, the insulating film 15 is formed with the ink supplying through-holes 22 and the contact hole 34. In this region, the passivation film 21 is formed with the ink supplying through-holes 22 and the pad openings 35 and 36.

In the inside region of the accommodating recess 52 in the protective substrate 4, the insulating film 15 and the passivation film 21 are formed only at an end portion (upper wiring region) where the upper wiring 17 is present. In this region, the passivation film 21 is formed such as to cover an upper surface and side surfaces of the upper wiring 17 of the insulating film 15. In other words, the insulating film 15 and the passivation film 21 are formed with openings 37 in those inside regions of the accommodating recesses 52 from which the upper wiring regions are excluded in plan view. The insulating film 15 is formed further with the contact holes 33.

Figure 10:
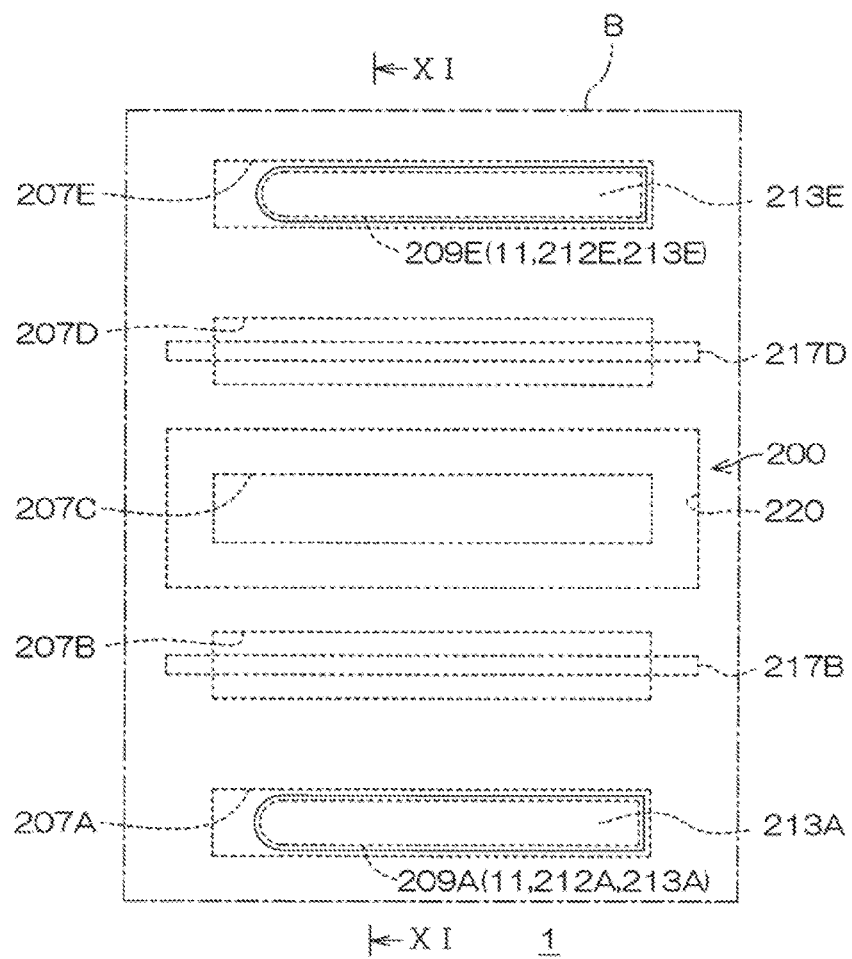
FIG. 10 is an illustrational partial enlarged plan view depicting a part B of FIG. 1 in an enlarged form, and is a plan view in which the protective substrate is omitted.
Figure 11:
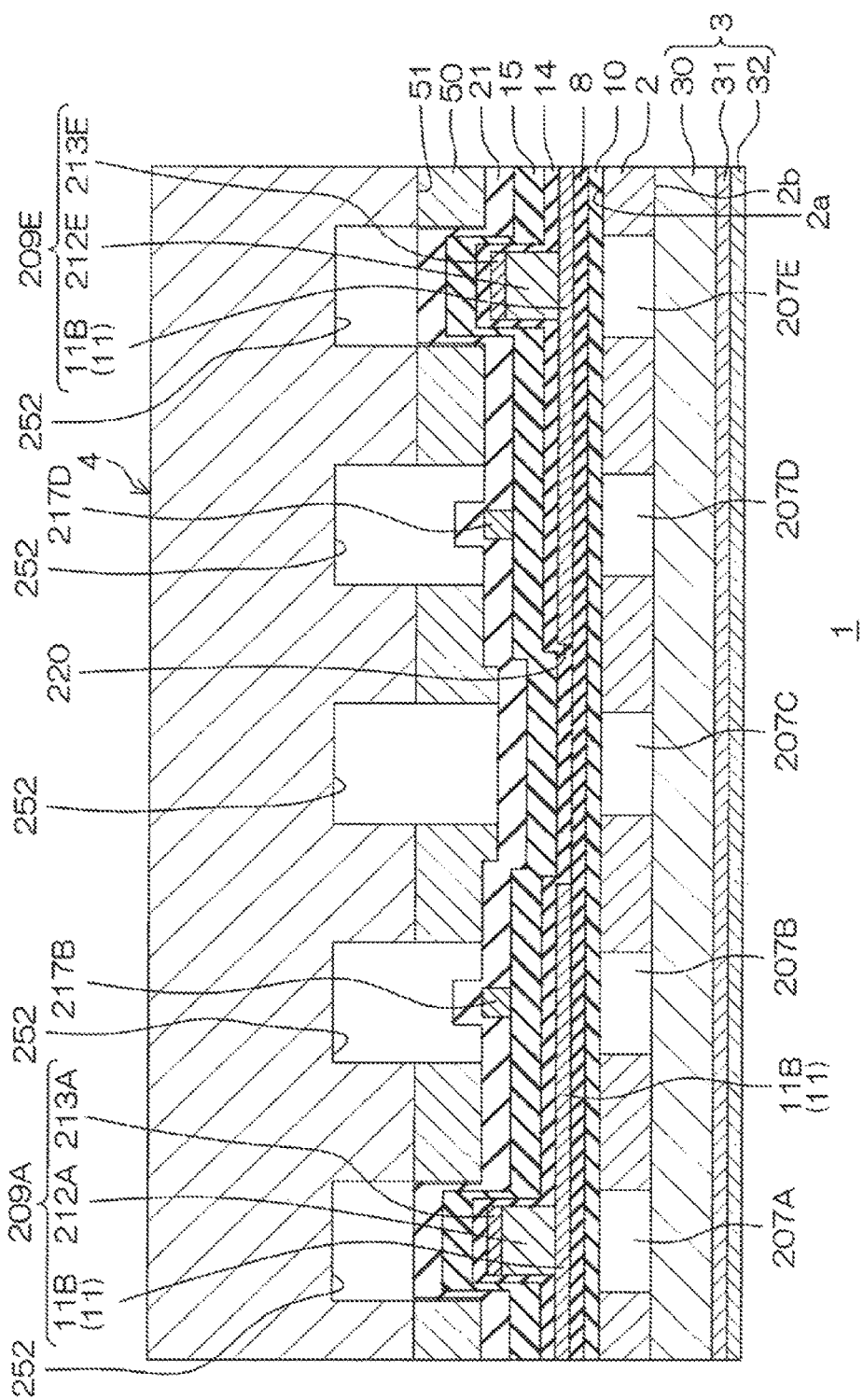
FIG. 11 is an illustrational sectional view taken along line XI-XI of FIG. 10, and is a sectional view including the protective substrate.

FIG. 10 is an illustrational partial enlarged plan view depicting a part B of FIG. 1 in enlarged form, and is a plan view in which the protective substrate is omitted. FIG. 11 is an illustrational sectional view taken along line XI-XI of FIG. 10, and is a sectional view including the protective substrate.

The dimension measuring pattern 200 includes: a plurality of dummy pressure chambers 207A to 207E disposed at intervals in the front-rear direction in plan view; a pair of dummy piezoelectric elements 209A and 209E disposed at an interval in the front-rear direction in plan view; and a pair of dummy wirings 217B and 217D disposed at an interval in the front-rear direction in plan view.

In this embodiment, the dimension measuring pattern 200 includes five dummy pressure chambers 207A to 207E. Each of the dummy pressure chambers 207A to 207E is the same in pattern (the same in shape) as the pressure chamber 7, and is formed in the same step as a step of forming the ink flow paths 5 (the pressure chambers 7). No ink inflow passage is formed for the dummy pressure chambers 207A to 207E, so that the dummy pressure chambers 207A to 207E are not filled with the ink.

Of the pair of dummy piezoelectric elements 209A and 209E, the dummy piezoelectric element 209A on one side is disposed on the upper side of the dummy pressure chamber 207A on the most front side, whereas the dummy piezoelectric element 209E on the other side is disposed on the upper side of the dummy pressure chamber 207E on the most rear side. The dummy piezoelectric element 209A on one side is formed at a position for facing the dummy pressure chamber 207A, with the movable membrane forming layer 10 and the metal barrier film 8 therebetween. Specifically, the dummy piezoelectric element 209A on the one side is formed such as to make contact with that surface of the metal barrier film 8 which is on the side opposite to the dummy pressure chamber 207A. The dummy piezoelectric element 209E on the other side is formed at a position for facing the dummy pressure chamber 207E, with the movable membrane forming layer 10 and the metal barrier film 8 therebetween. Specifically, the dummy piezoelectric element 209E on the other side is formed such as to make contact with that surface of the metal barrier film 8 which is on the side opposite to the dummy pressure chamber 207E.

Each of dummy piezoelectric elements 209A and 209E includes: the lower electrode 11 formed on the metal barrier film 8; a dummy piezoelectric film 212A or 212E formed on the lower electrode 11; and a dummy upper electrode 213A or 213E formed on the dummy piezoelectric film 212A or 212E. The lower electrode 11 constituting each dummy piezoelectric element 209A or 209E includes the extension section 11B of the lower electrode 11. The dummy piezoelectric films 212A and 212E have the same pattern as that of the piezoelectric film 12. The dummy piezoelectric films 212A and 212E are formed of the same material as that of the piezoelectric film 12, and are formed in the same step as a step of forming the piezoelectric film 12. The dummy upper electrodes 213A and 213E have the same pattern as that of the upper electrode 13. The dummy upper electrodes 213A and 213E are formed of the same material as that of the upper electrode 13, and are formed in the same step as a step of forming the upper electrode 13. The dummy upper electrodes 213A and 213E are not connected to wiring such as the upper wiring 17. Therefore, each dummy piezoelectric element 209A or 209E does not function as a piezoelectric element.

In the case where there is no relative positional deviation between the pressure chambers 9 (the dummy pressure chambers 207A to 207E) and the upper electrodes 13 (the dummy upper electrodes 213A and 213E), the dummy upper electrode 213A on one side is a dummy upper electrode to be disposed spaced by a predetermined first spacing toward the front side from the central dummy pressure chamber 207C. In addition, the dummy upper electrode 213E on the other side is a dummy upper electrode to be disposed spaced by the predetermined first spacing toward the rear side from the central dummy pressure chamber 207C.

A surface of each of the dummy piezoelectric elements 209A and 209E is covered with the hydrogen barrier film 14, the insulating film 15 and the passivation film 21. No dummy piezoelectric element is formed on the upper side of the three dummy pressure chambers 207B, 207C, and 207D other than the two dummy pressure chambers 207A and 207E at both ends in regard of the front-rear direction, of the five dummy pressure chambers 207A to 207E.

Of the pair of dummy wirings 217B and 217D, the dummy wiring 217B on one side is disposed on the upper side of the second frontmost dummy pressure chamber 207B, whereas the dummy wiring 217D on the other side is disposed on the upper side of the second rearmost dummy pressure chamber 207D. The dummy wiring 217B on the one side is formed at a position for facing the dummy pressure chamber 207B, with the movable membrane forming layer 10, the metal barrier film 8, the lower electrode 11, the hydrogen barrier film 14 and the insulating film 15 interposed therebetween. Specifically, the dummy wiring 217B on the one side is formed such as to make contact with that surface of the insulating film 15 which is on the side opposite to the dummy pressure chamber 207B. The dummy piezoelectric element 209D on the other side is formed at a position for facing the dummy pressure chamber 207D, with the movable membrane forming layer 10, the metal barrier film 8, the lower electrode 11, the hydrogen barrier film 14 and the insulating film 15 interposed therebetween. Specifically, the dummy piezoelectric element 209D on the other side is formed such as to make contact with that surface of the insulating film 15 which is on the side opposite to the dummy pressure chamber 207D.

Each dummy wiring 217B or 217D has a belt-like shape elongated in the left-right direction, and passes a central portion of width of the corresponding dummy pressure chamber 207B or 207D, in plan view. Both end portions of each dummy wiring 217B or 217D protrudes outward from both end edges of the corresponding dummy pressure chamber 207B or 207D, in plan view. Each dummy wiring 217B or 217D is not electrically connected to the upper wiring 17 or the lower wiring 18, and is therefore an electrically insulated wiring. The surface of each dummy wiring 217B or 217D is covered with the passivation film 21.

In the case where there is no relative positional deviation between the pressure chambers 9 (the dummy pressure chambers 207A to 207E) and the upper wirings 17 (the dummy wirings 217B and 217D), the dummy wiring 217B on one side is a dummy wiring to be disposed spaced by a predetermined second spacing toward the front side from the central dummy pressure chamber 207C. In addition, the dummy wiring 217D on the other side is a dummy wiring to be disposed spaced by the predetermined second spacing toward the rear side from the central dummy pressure chamber 207C.

The lower electrode 11 (the extension section 11B of the lower electrode 11) is formed with a cut-away portion 220 in a region including the central dummy pressure chamber 207, in plan view. The cut-away portion 220 is a portion where the lower electrode 11 is cut away. The cut-away portion 220 has a rectangular shape larger than the dummy pressure chamber, in plan view. The length in the longitudinal direction (the left-right direction) of the cut-away portion 220 is longer than the length in the longitudinal direction of the ceiling surface portion of the dummy pressure chamber 207C. Both end edges of the cut-away portion 220 are disposed on the outer side of, and spaced by a predetermined spacing from, the corresponding end edges of the ceiling surface portion of the dummy pressure chamber 207C. In addition, the width in the transverse direction (the front-rear direction) of the cut-away portion 220 is wider than the width in the transverse direction of the ceiling surface portion of the dummy pressure chamber 207C. Both side edges of the cut-away portion 220 are disposed on the outer side of, and spaced by a predetermined spacing from, the corresponding side edges of the ceiling surface portion of the dummy pressure chamber 207C. Since the lower electrode 11 is thus formed with the cut-away portion 220, the lower electrode 11 is not present on the upper side of both side edges of the ceiling surface portion of the central dummy pressure chamber 207C.

The opposed surface 51 of the protective substrate 4 is formed with recesses 252 similar to the recesses 52, at positions for facing the dummy pressure chambers 207A to 207E, in this embodiment. The dummy piezoelectric element 209A is accommodated in the recess 252 corresponding to the dummy pressure chamber 207A, and the dummy piezoelectric element 209E is accommodated in the recess 252 corresponding to the dummy pressure chamber 207E. A method of utilizing the dimension measuring pattern 200 will be described later.

An outline of a method of manufacturing the ink jet print head 1 will be given below.

Figure 12:
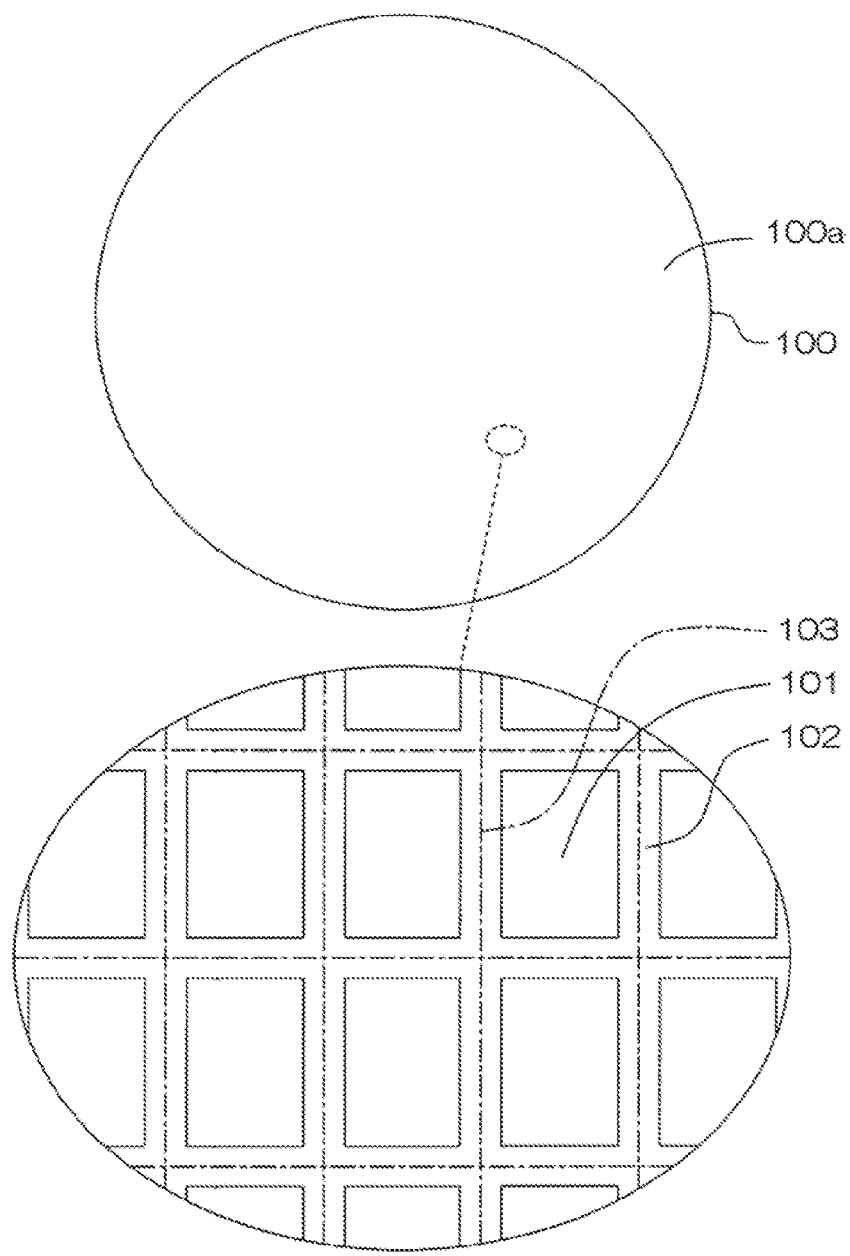
FIG. 12 is a plan view of a semiconductor wafer as an original substrate of an actuator substrate.

FIG. 12 is a plan view of a semiconductor wafer as an original substrate for an actuator substrate, in which a partial region is depicted in an enlarged form.

A semiconductor wafer (actuator wafer) 100 as an original substrate for the actuator substrate 2 includes, for example, a silicon wafer. A surface 100*a* of the actuator wafer 100 corresponds to the surface 2*a* of the actuator substrate 2. In the surface 100*a* of the actuator wafer 100, a plurality of functional element forming regions 101 are arranged in a matrix. A scribe region (boundary region) 102 is provided between the adjacent functional element forming regions 101. The scribe regions 102 are belt-shaped regions having a substantially constant width, and are formed in a grid-like pattern to extend in two orthogonal directions. In the scribe regions 102, cutting lines 103 are set. By subjecting the actuator wafer 100 to required steps, a substrate assembly aggregate (SA aggregate) 110 is formed in which the ink flow paths 5 and the dummy pressure chambers 207A to 207E have not been formed but the configuration of the substrate assembly SA has been formed on each functional element forming region 101.

A protective substrate aggregate 130 (see FIGS. 13K and 14H) integrally including a plurality of protective substrates 4 corresponding to the functional element forming regions 101 of the substrate assembly aggregate 110 is preliminarily prepared. The protective substrate aggregate 130 is produced by subjecting a semiconductor wafer (protective substrate wafer) as an original substrate for the protective substrate 4 to required steps. The protective substrate wafer includes, for example, a silicon wafer.

In addition, a nozzle substrate aggregate 150 (see FIGS. 13M and 14J) integrally including a plurality of nozzle substrates 3 corresponding to the functional element forming regions 101 of the substrate assembly aggregate 110 is preliminarily prepared. The nozzle substrate aggregate 150 is produced by subjecting a semiconductor wafer (nozzle wafer) as an original substrate for the nozzle substrate 3 to required steps. The nozzle wafer includes, for example, a silicon wafer. As depicted in FIGS. 13M and 14J, the nozzle substrate aggregate 150 includes a nozzle wafer 140, a silicon oxide (SiO2) film 142 formed on a surface (one side) of the nozzle wafer 140, and a water-repellent film 143 formed on a surface of the silicon oxide film 142.

When the substrate assembly aggregate 110 is fabricated, the protective substrate aggregate 130 is joined to the substrate assembly aggregate 110. Next, the substrate assembly aggregate 110 is formed with the ink flow paths 5 and the dummy pressure chambers 207A to 207E. Subsequently, the nozzle substrate aggregate 150 is joined to the substrate assembly aggregate 110. By this, an ink jet print head aggregate 170 including the substrate assembly aggregate 110, the protective substrate aggregate 130 and the nozzle substrate aggregate 150 is obtained. Thereafter, the ink jet print head aggregate 170 is cut (diced) along the cutting lines 103 by a dicing blade. By this, individual ink jet print heads (chips) 1 including the functional element forming regions 101 are obtained through cutting. The ink jet print head 1 has the scribe region 102 at a peripheral edge portion thereof, and has the functional element forming region 101 in a central region surrounded by the scribe region 102.

The method of manufacturing the ink jet print head 1 will be specifically described below.

FIGS. 13A to 13M are sectional views depicting steps for manufacturing the ink jet print head 1, and are sectional views corresponding to the section of FIG. 4. FIGS. 14A to 14J are sectional views depicting steps for manufacturing the ink jet print head 1, and are sectional views corresponding to the section of FIG. 11.

Figure 13A:
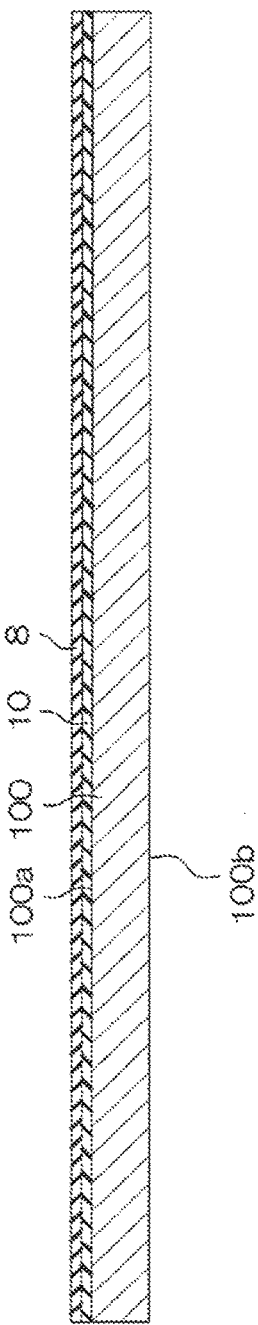
FIG. 13A is a sectional view depicting an example of a manufacturing step of the ink jet print head.
Figure 14A:
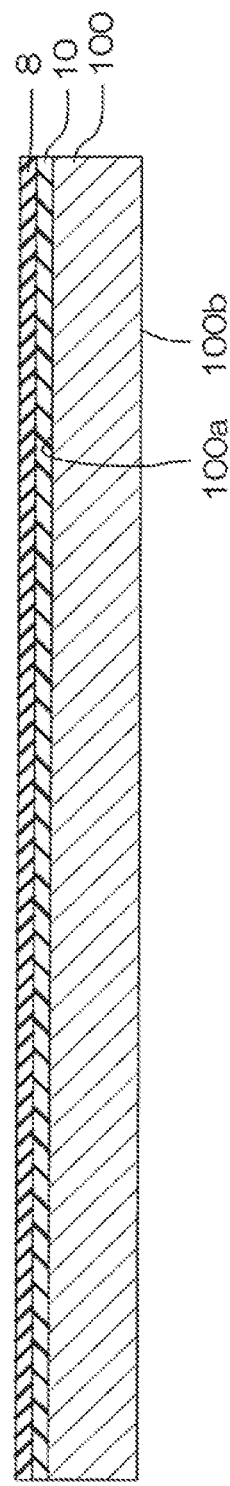
FIG. 14A is a sectional view depicting an example of a manufacturing step of the ink jet print head, and is a sectional view corresponding to a section of FIG. 11.

First, as depicted in FIGS. 13A and 14A, the actuator wafer 100 is prepared. It is to be noted that as the actuator wafer 100, one that is thicker than the final actuator substrate 2 is used. Then, the movable membrane forming layer 10 is formed on the surface 100*a* of the actuator wafer 100. Specifically, a silicon oxide film (1.2 μm thick, for example) is formed on the surface 100*a* of the actuator wafer 100. In the case where the movable membrane forming layer 10 includes a stacked film of a silicon film, a silicon oxide film, and a silicon nitride film, a silicon film (0.4 μm thick, for example) is formed on the surface of the actuator substrate 2, a silicon oxide film (0.4 μm thick, for example) is formed on the silicon film, and a silicon nitride film (0.4 μm thick, for example) is formed on the silicon oxide film.

Next, the metal barrier film 8 is formed on the movable membrane forming layer 10. The metal barrier film 8 includes, for example, an Al2O3 film (50 to 100 nm thick, for example). The metal barrier film 8 prevents metallic atoms from coming out of the piezoelectric film 12 which is formed later. If metallic atoms come out of the piezoelectric film 12, piezoelectric characteristics of the piezoelectric film 12 may be deteriorated. Besides, if the metallic atoms coming out of the piezoelectric film 12 mix into a silicon layer constituting the movable membrane 10A, durability of the movable membrane 10A may be lowered.

Figure 13B:
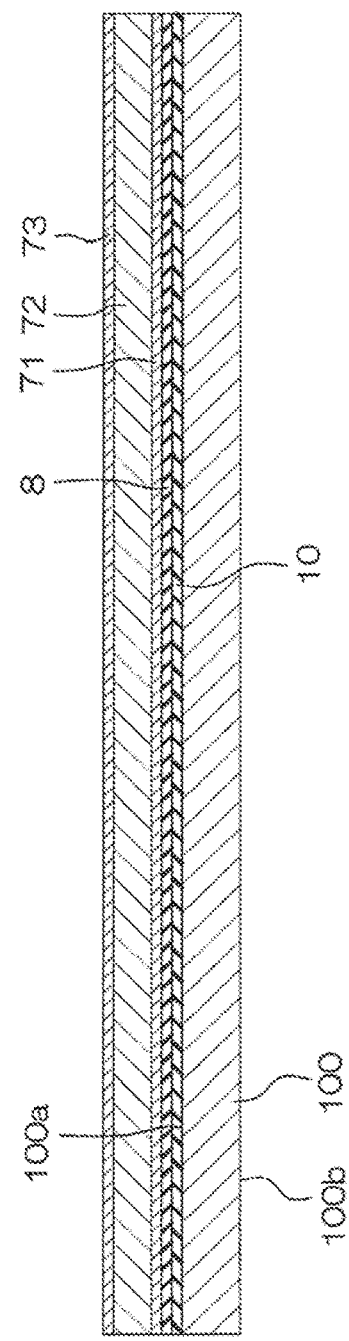
FIG. 13B is a sectional view depicting a step next to FIG. 13A.
Figure 14B:
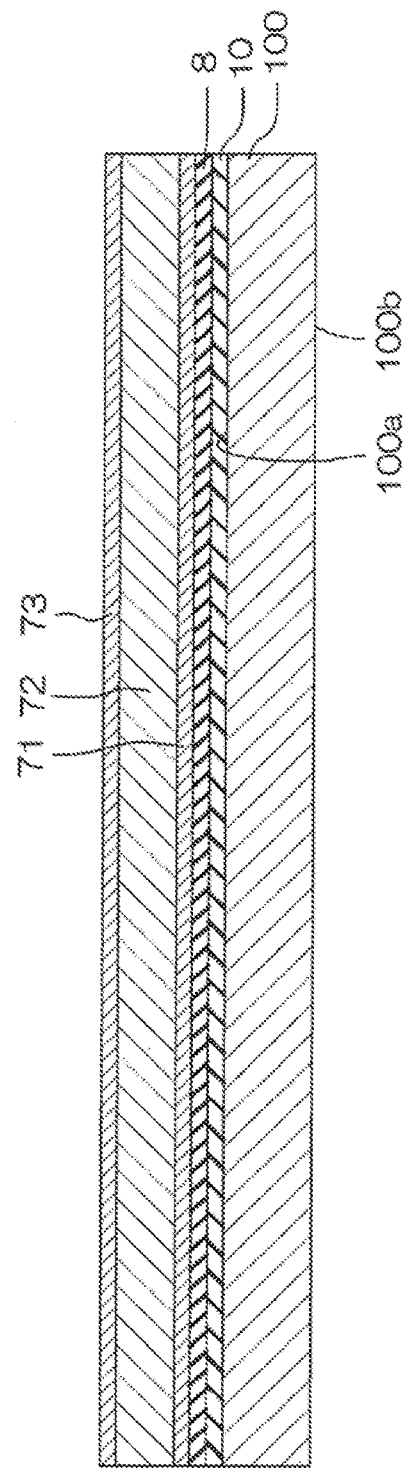
FIG. 14B is a sectional view depicting a step next to FIG. 14A.

Subsequently, as depicted in FIGS. 13B and 14B, a lower electrode film 71 as a material layer for the lower electrode 11 is formed on the metal barrier film 8. The lower electrode film 71 includes, for example, a Pt/Ti stacked film including a Ti film (10 to 40 nm thick, for example) as a lower layer and a Pt film (10 to 400 nm thick, for example) as an upper layer. Such a lower electrode film 71 may be formed by a sputtering method.

Next, a piezoelectric material film 72 as a material for the piezoelectric film 12 and the dummy piezoelectric films 212A and 212E is formed on the whole surface of the lower electrode film 71. Specifically, for example, a piezoelectric material film 72 having a thickness of 1 to 3 μm is formed by a sol-gel method. Such a piezoelectric material film 72 includes a sintered body of metallic oxide crystal grains.

Subsequently, the upper electrode film 73 as a material for the upper electrode 13 and the dummy upper electrodes 213A and 213E is formed on the whole surface of the piezoelectric material film 72. The upper electrode film 73 may, for example, be a single film of platinum (Pt). The upper electrode film 73 may, for example, be an IrO2/Ir stacked film including an IrO2 film (40 to 160 nm thick, for example) as a lower layer and an Ir film (40 to 160 nm thick, for example) as an upper layer. Such an upper electrode film 73 may be formed by a sputtering method.

Figure 13C:
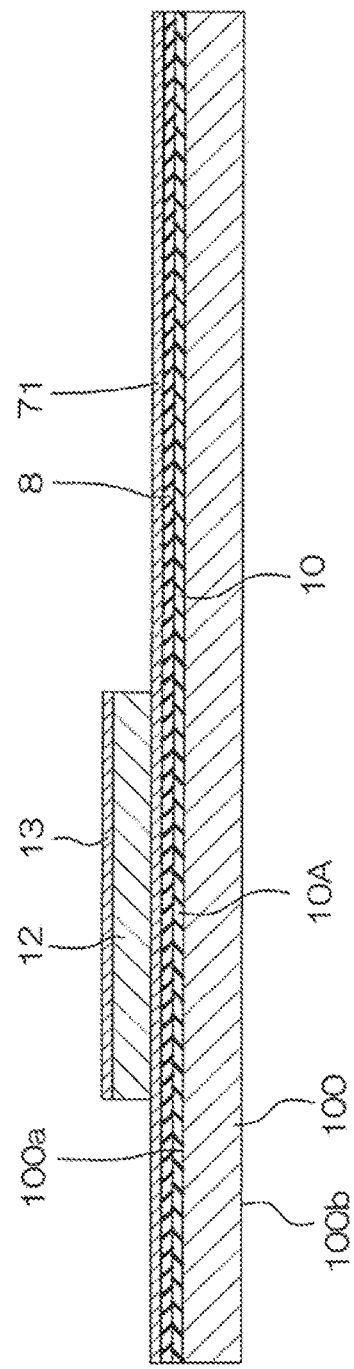
FIG. 13C is a sectional view depicting a step next to FIG. 13B.
Figure 14C:
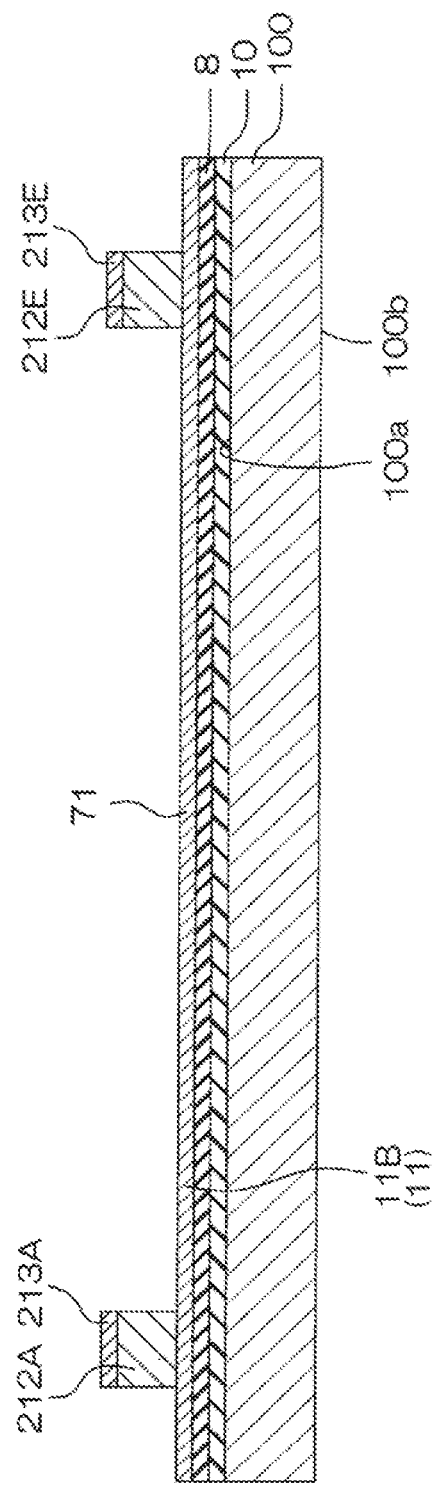
FIG. 14C is a sectional view depicting a step next to FIG. 14B.

Next, as depicted in FIGS. 13C and 14C and FIGS. 13D and 14D, patterning of the upper electrode film 73, the piezoelectric material film 72 and the lower electrode film 71 is conducted. First, a resist mask for the patterns of the upper electrode 13 and the dummy upper electrodes 213A and 213E is formed by photolithography. Then, as depicted in FIGS. 13C and 14C, using this resist mask as a mask, the upper electrode film 73 and the piezoelectric material film 72 are continuously etched, whereby the upper electrode 13 and the piezoelectric film 12 in a predetermined pattern as well as the dummy upper electrodes 213A and 213E and the dummy piezoelectric films 212A and 212E in predetermined patterns are formed.

Subsequently, the resist mask is peeled off, after which a resist mask for a pattern of the lower electrode 11 is formed by photolithography. Then, as depicted in FIGS. 13D and 14D, using this resist mask as a mask, the lower electrode film 71 is etched, whereby the lower electrode 11 in a predetermined pattern is formed. By this, the lower electrode 11 including the main electrode section 11A and the extension section 11B which has the through-hole 23 and the cut-away portion 220 is formed. In this way, the piezoelectric element 9 including the main electrode section 11A of the lower electrode 11, the piezoelectric film 12 and the upper electrode 13 is formed. In addition, the dummy piezoelectric element 209A including the extension section 11B of the lower electrode 11, the dummy piezoelectric film 212A and the dummy upper electrode 213A and the dummy piezoelectric element 209E including the extension section 11B of the lower electrode 11, the dummy piezoelectric film 212E and the dummy upper electrode 213E are formed.

Figure 13E:
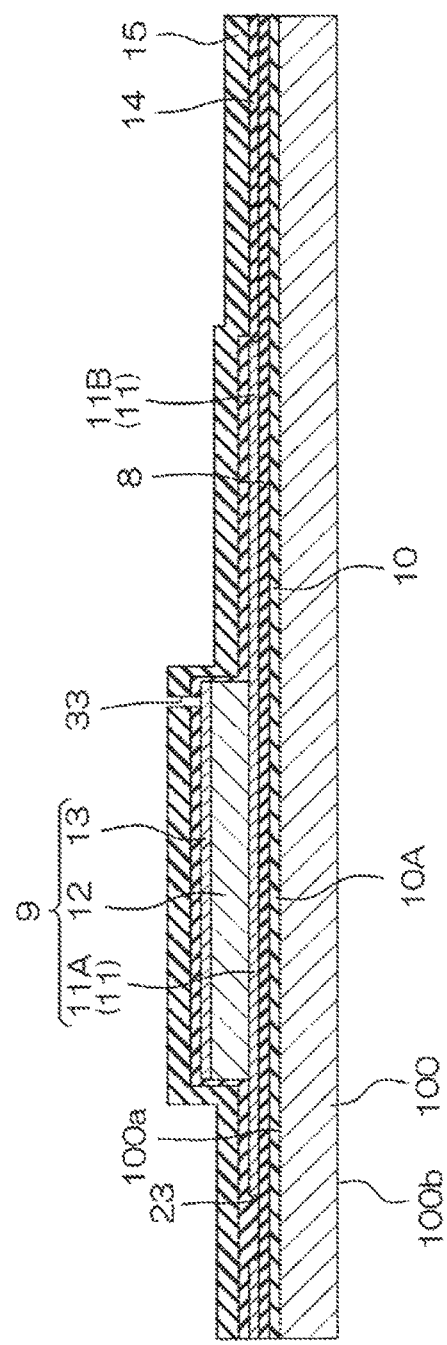
FIG. 13E is a sectional view depicting a step next to FIG. 13D.
Figure 14E:
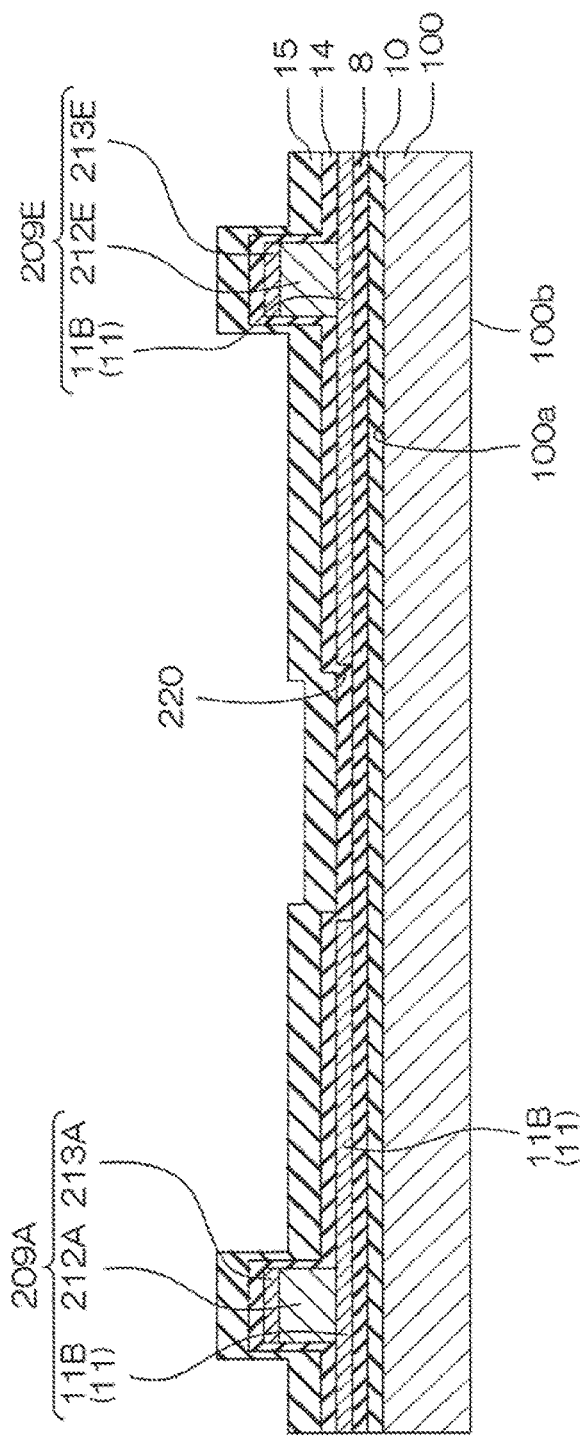
FIG. 14E is a sectional view depicting a step next to FIG. 14D.

Next, as depicted in FIGS. 13E and 14E, the resist mask is peeled off, after which the hydrogen barrier film 14 covering the whole surface is formed. The hydrogen barrier film 14 may be an Al2O3 film formed by a sputtering method, and its thickness may be 50 to 100 nm. Thereafter, the insulating film 15 is formed on the whole surface of the hydrogen barrier film 14. The insulating film 15 may be an SiO2 film, and its thickness may be 200 to 300 nm. Subsequently, the insulating film 15 and the hydrogen barrier film 14 are continuously etched, whereby the contact holes 33 and 34 are formed.

Figure 13F:
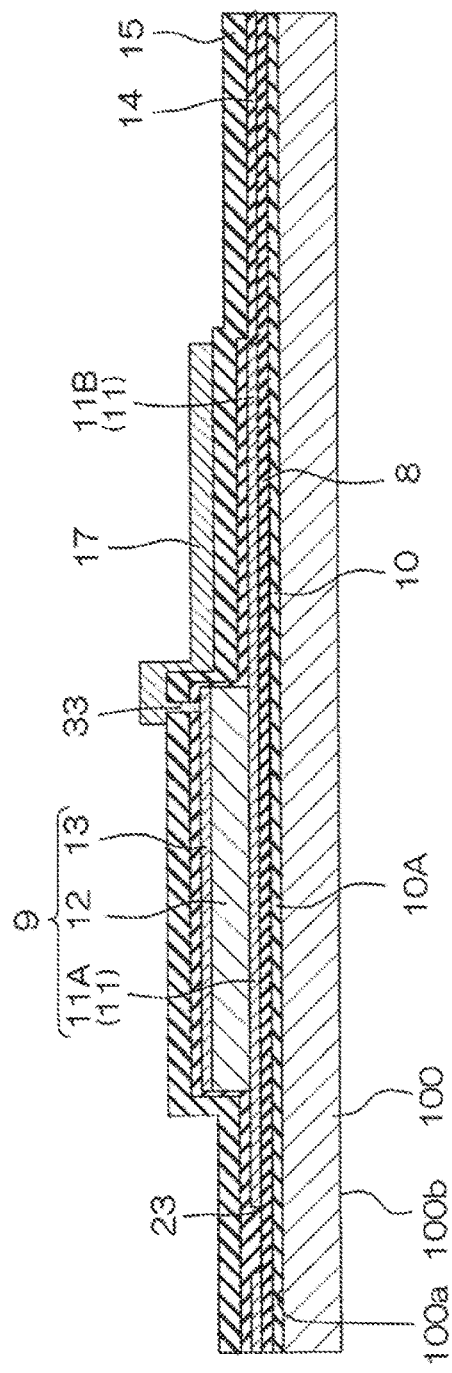
FIG. 13F is a sectional view depicting a step next to FIG. 13E.
Figure 14F:
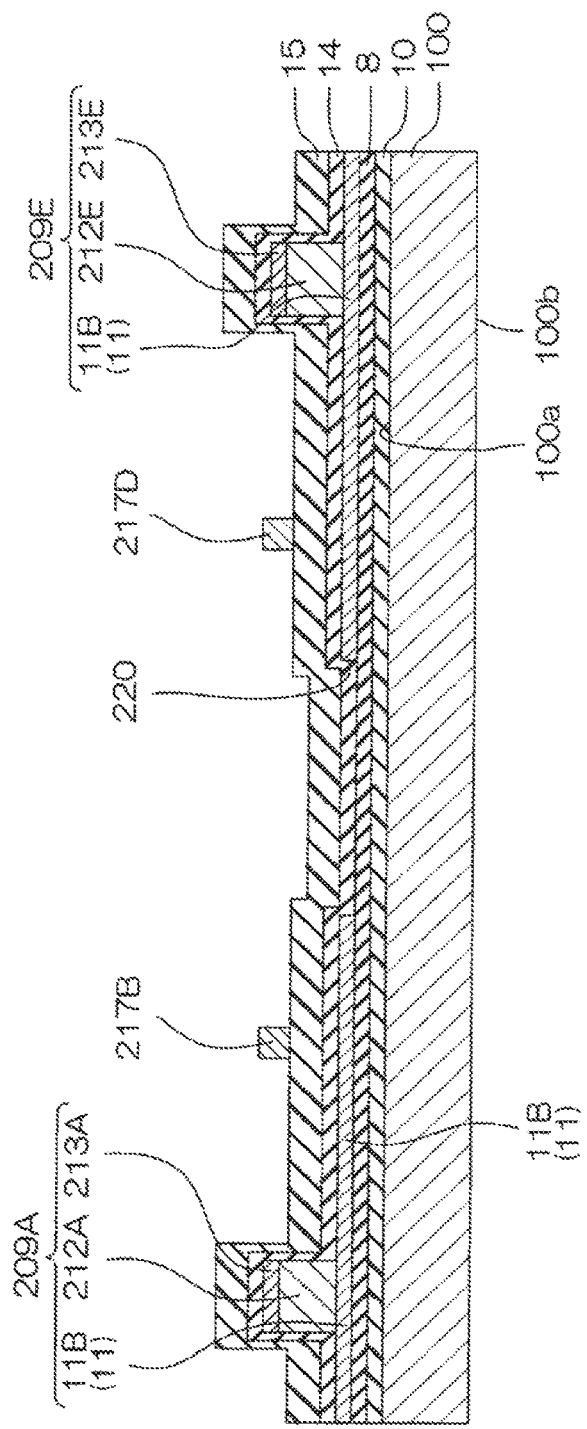
FIG. 14F is a sectional view depicting a step next to FIG. 14E.

Subsequently, as depicted in FIG. 13F and 14F, a wiring film for constituting the upper wiring 17, the lower wiring 18 and the dummy wirings 217B and 217D is formed on the insulating film 15 inclusive of the inside of the contact holes 33 and 34 by a sputtering method. Thereafter, the wiring film is patterned by photolithography and etching, whereby the upper wiring 17, the lower wiring 18 and the dummy wirings 217B and 217D are simultaneously formed.

Figure 13G:
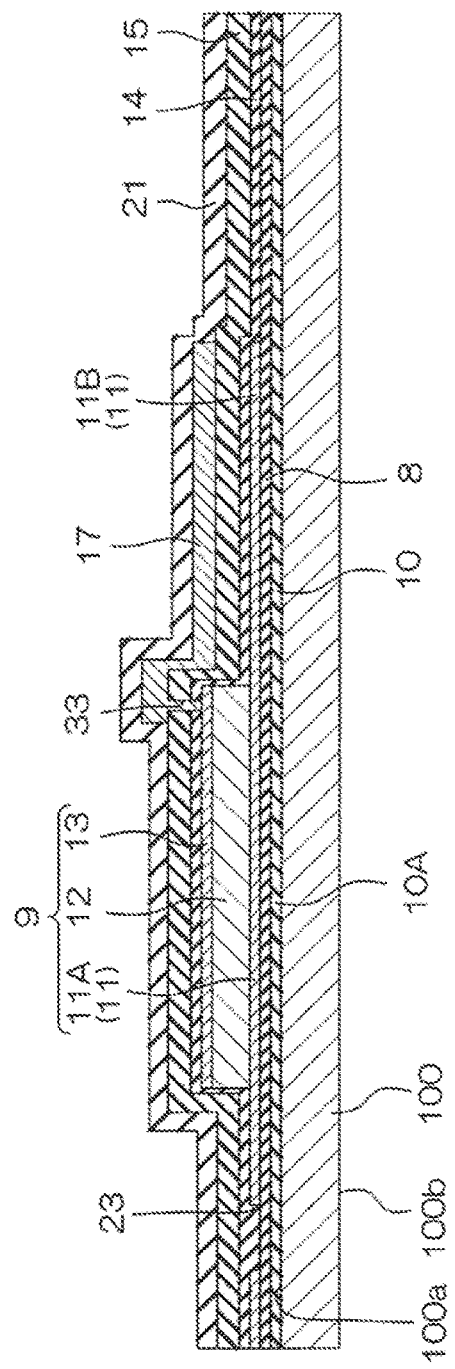
FIG. 13G is a sectional view depicting a step next to FIG. 13F.
Figure 14G:
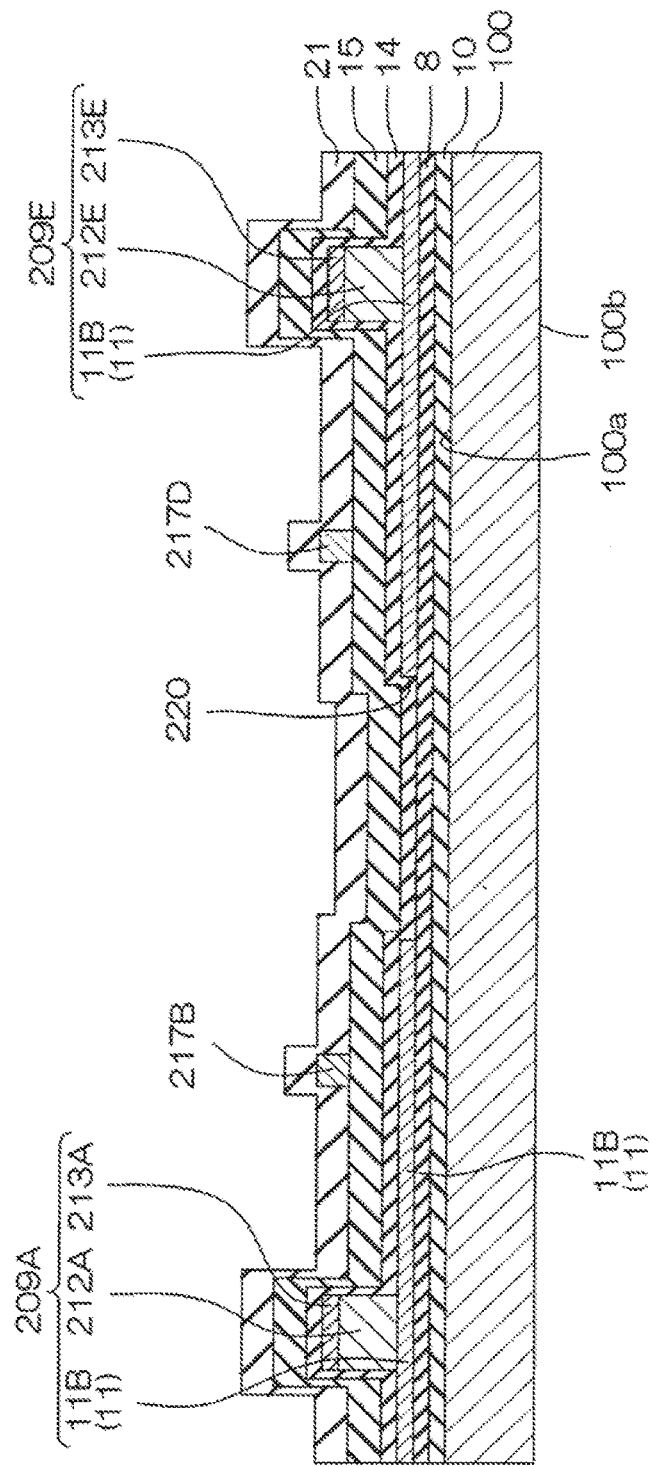
FIG. 14G is a sectional view depicting a step next to FIG. 14F.

Next, as depicted in FIGS. 13G and 14G, the passivation film 21 for covering the wirings 17, 18, 217B, and 217D is formed on the surface of the insulating film 15. The passivation film 21 is formed, for example, of SiN. The passivation film 21 is formed, for example, by plasma chemical vapor deposition (CVD).

Figure 13H:
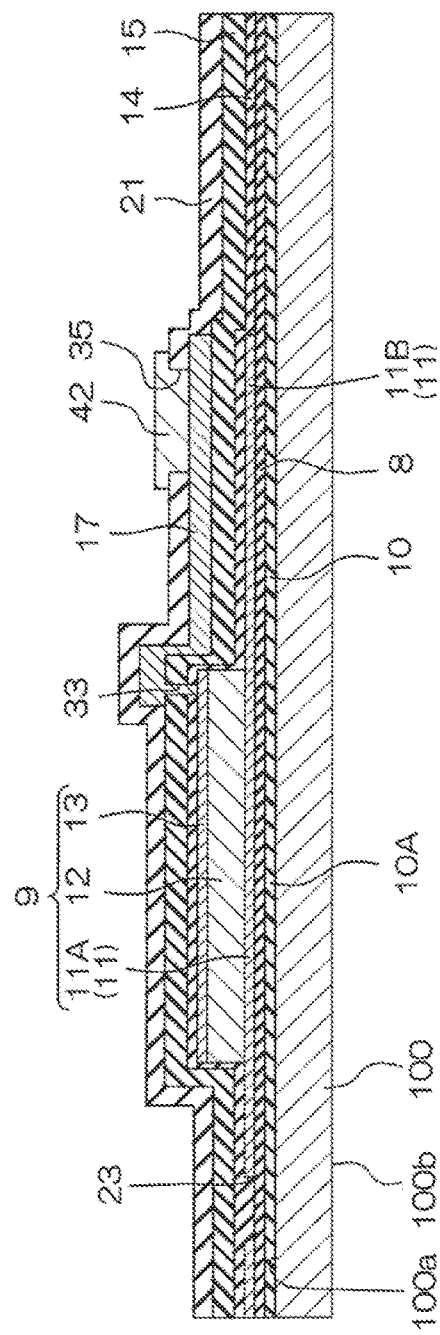
FIG. 13H is a sectional view depicting a step next to FIG. 13G.

Subsequently, a resist mask having openings corresponding to the pad openings 35 and 36 is formed by photolithography, and, with this resist mask as a mask, the passivation film 21 is etched. By this, the pad openings 35 and 36 are formed in the passivation film 21, as depicted in FIG. 13H. After the resist mask is peeled off, the upper electrode pad 42 and the lower electrode pad 43 are formed on the passivation film 21 through the pad openings 35 and 36.

Figure 13I:
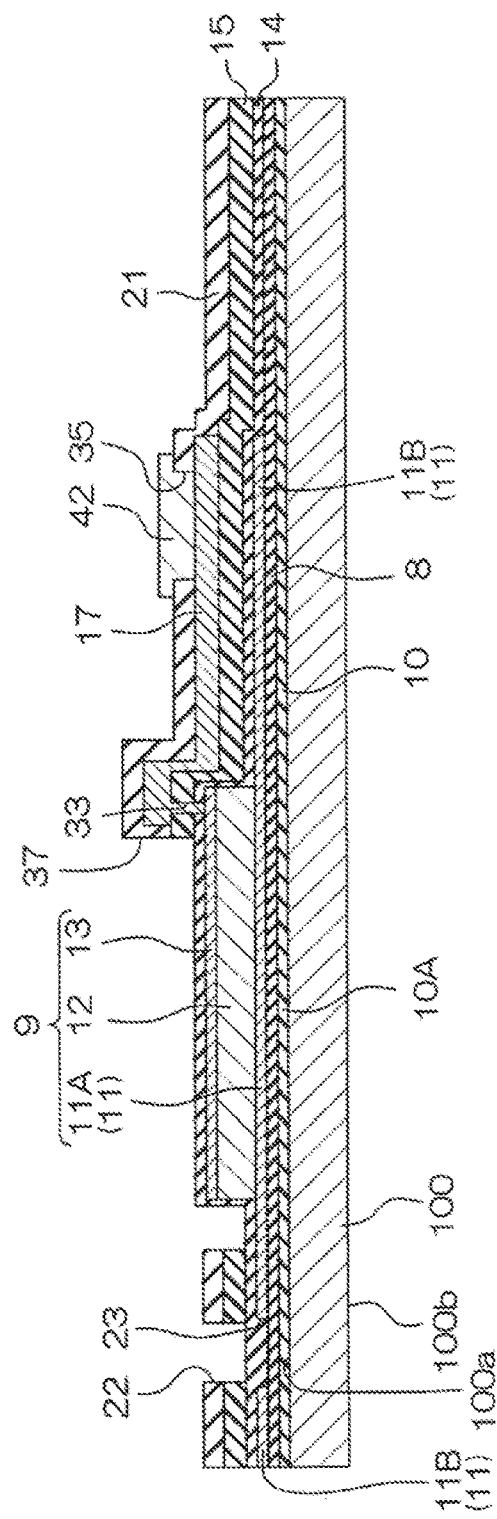
FIG. 13I is a sectional view depicting a step next to FIG. 13H.

Next, a resist mask having openings corresponding to the openings 37 and the ink supplying through-holes 22 is formed by photolithography, and, with this resist mask as a mask, the passivation film 21 and the insulating film 15 are continuously etched. By this, the openings 37 and the ink supplying through-holes 22 are formed in the passivation film 21 and the insulating film 15, as depicted in FIG. 13I.

Figure 13J:
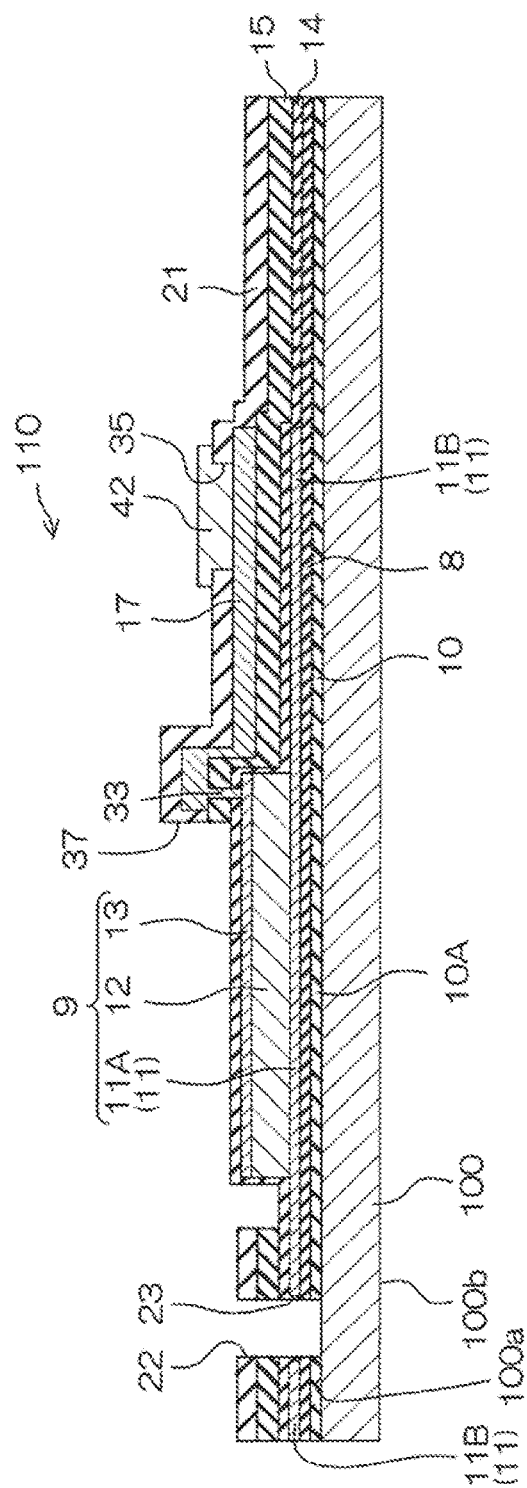
FIG. 13J is a sectional view depicting a step next to FIG. 13I.

Subsequently, the resist mask is peeled off. Then, a resist mask having openings corresponding to the ink supplying through-holes 22 is formed by photolithography, and, with this resist mask as a mask, the hydrogen barrier film 14, the metal barrier film 8 and the movable membrane forming layer 10 are etched. By this, the ink supplying through-holes 22 are formed in the hydrogen barrier film 14, the metal barrier film 8 and the movable membrane forming layer 10, as depicted in FIG. 13J. As a result, the substrate assembly aggregate 110 is fabricated.

Figure 13K:
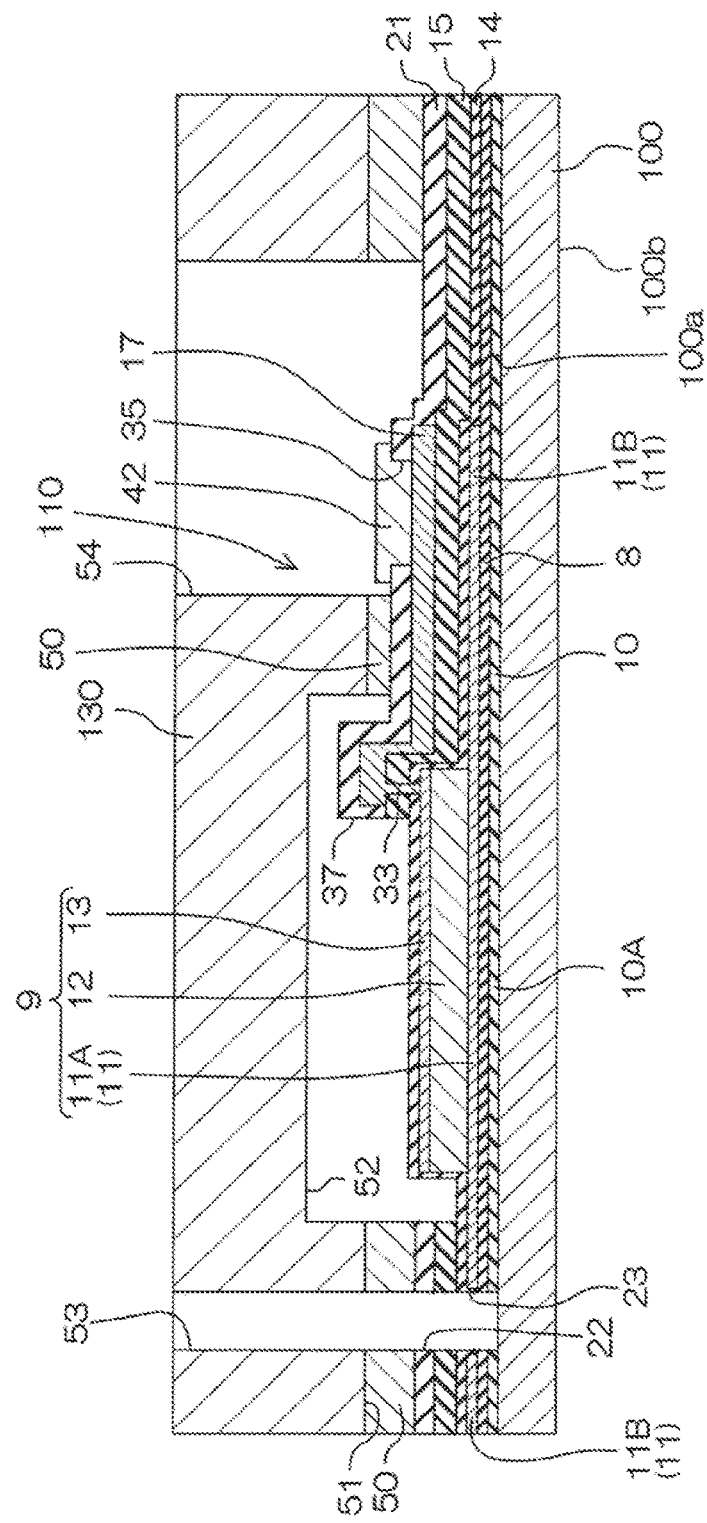
FIG. 13K is a sectional view depicting a step next to FIG. 13J.
Figure 14H:
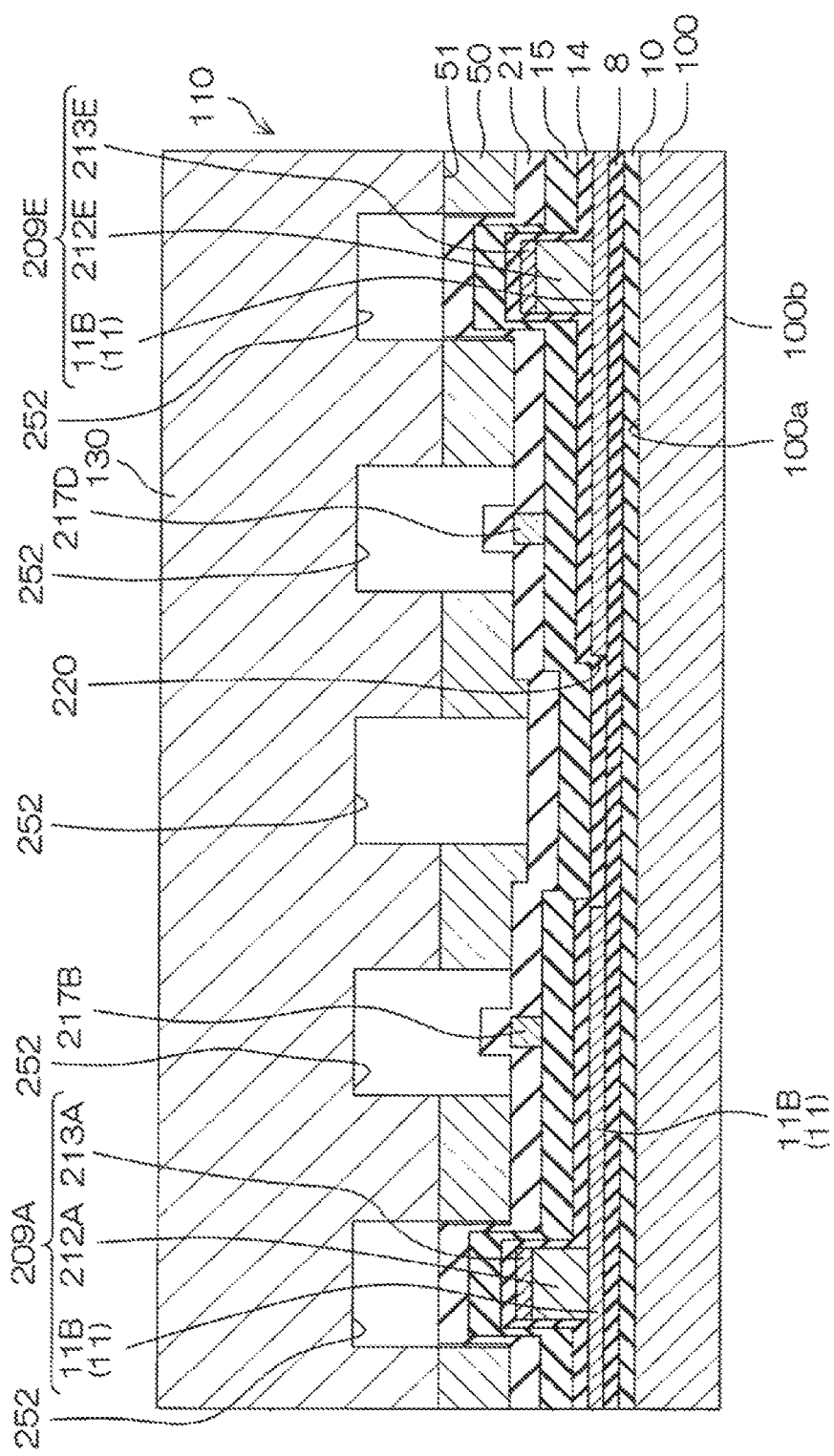
FIG. 14H is a sectional view depicting a step next to FIG. 14G.

Next, as illustrated in FIGS. 13K and 14H, an adhesive 50 is applied to the opposed surface 51 of the protective substrate aggregate 130, and the protective substrate aggregate 130 is fixed to the substrate assembly aggregate 110 in such a manner that the ink supply passages 53 and the ink supplying through-holes 22 corresponding thereto come into register.

Figure 13L:
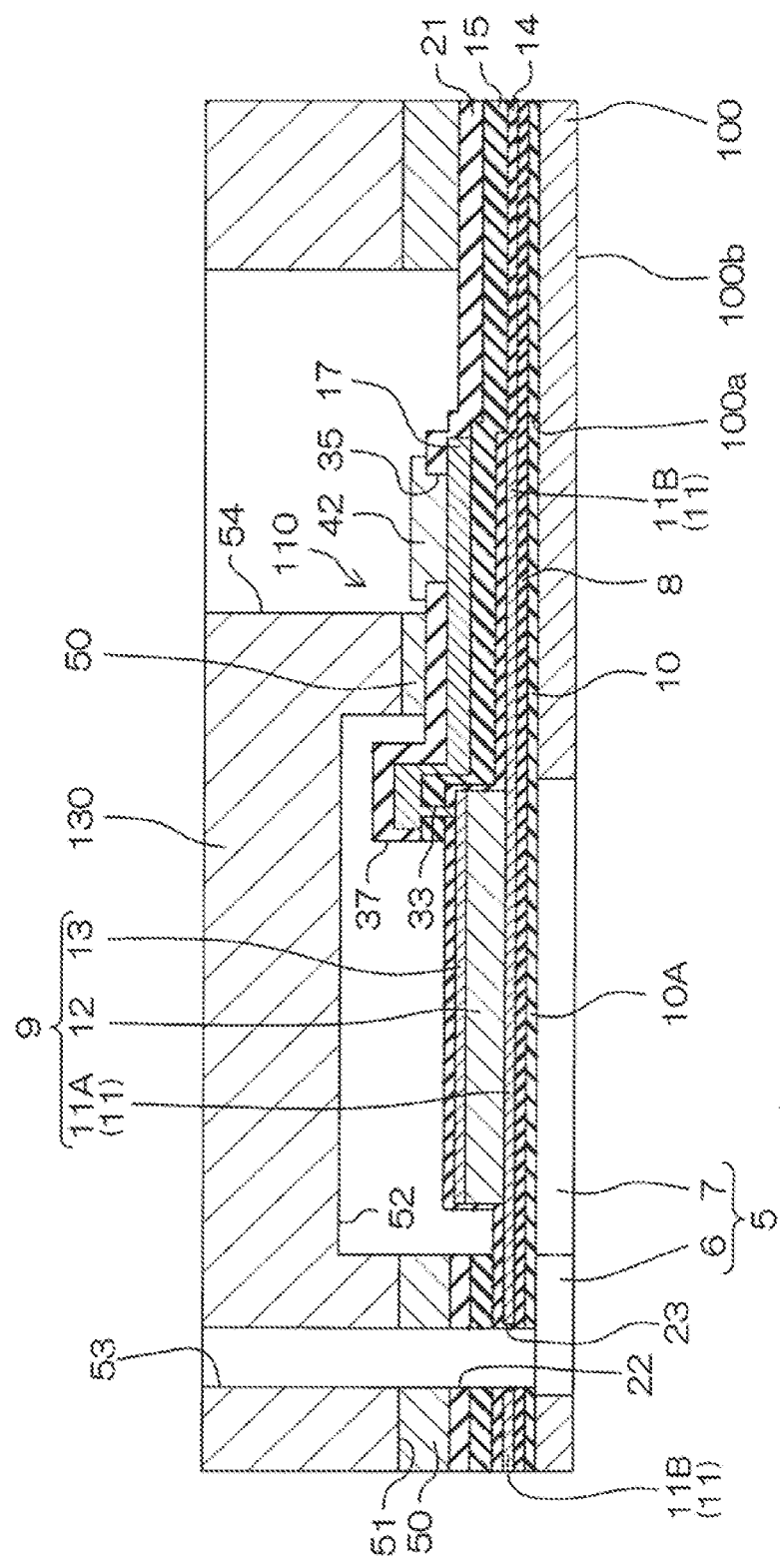
FIG. 13L is a sectional view depicting a step next to FIG. 13K.
Figure 13M:
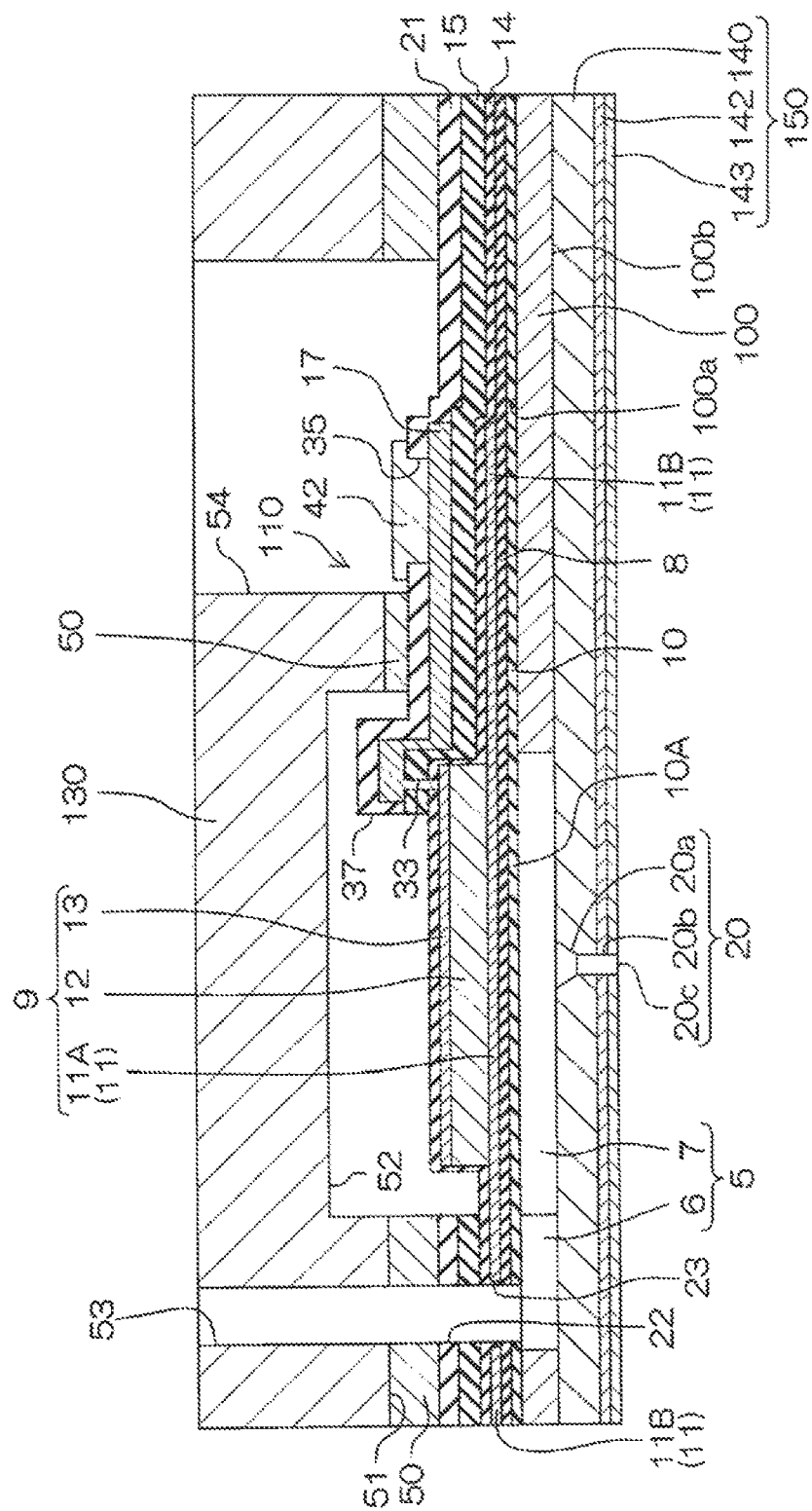
FIG. 13M is a sectional view depicting a step next to FIG. 13L.
Figure 14I:
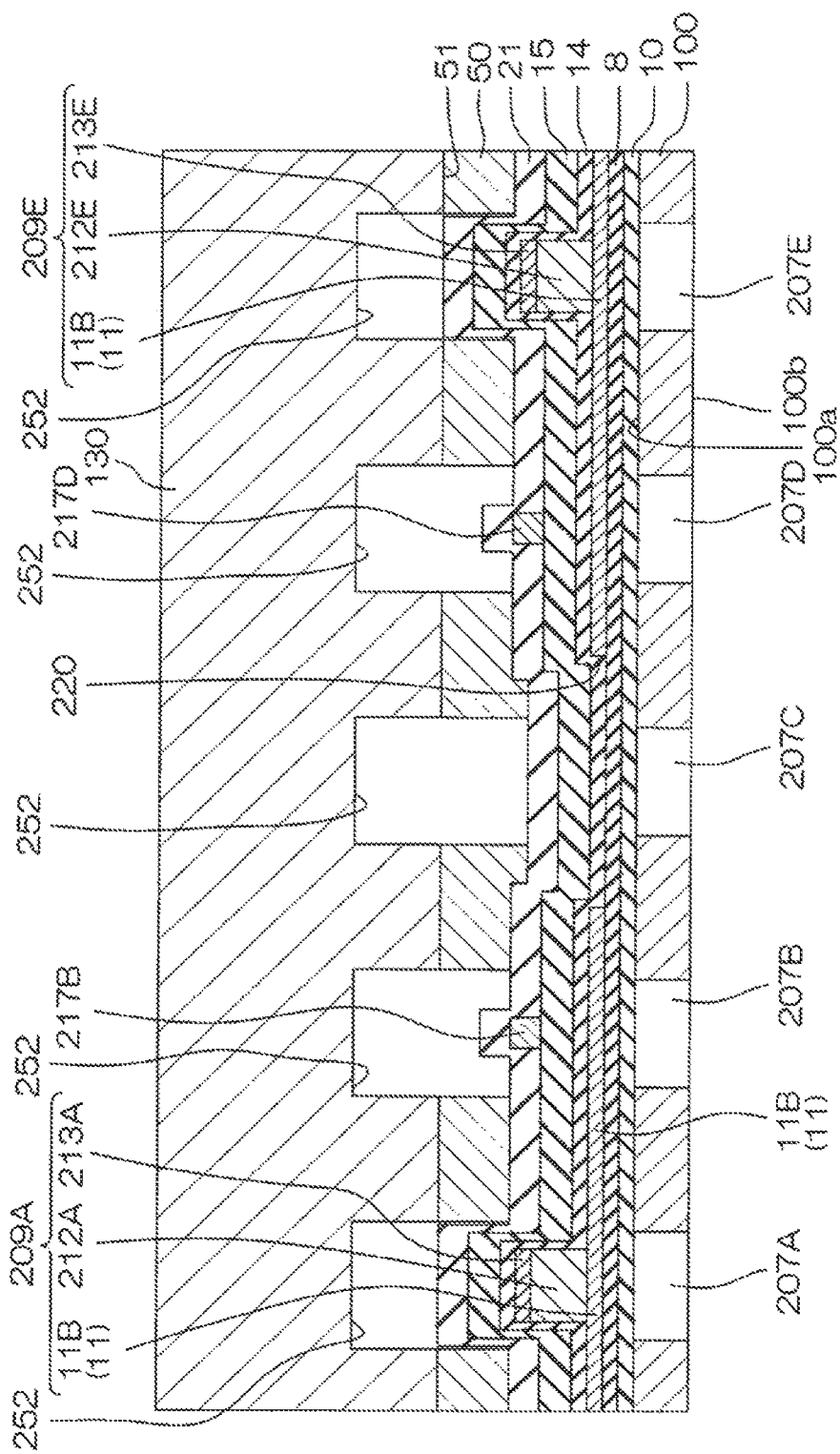
FIG. 14I is a sectional view depicting a step next to FIG. 14H.
Figure 14J:
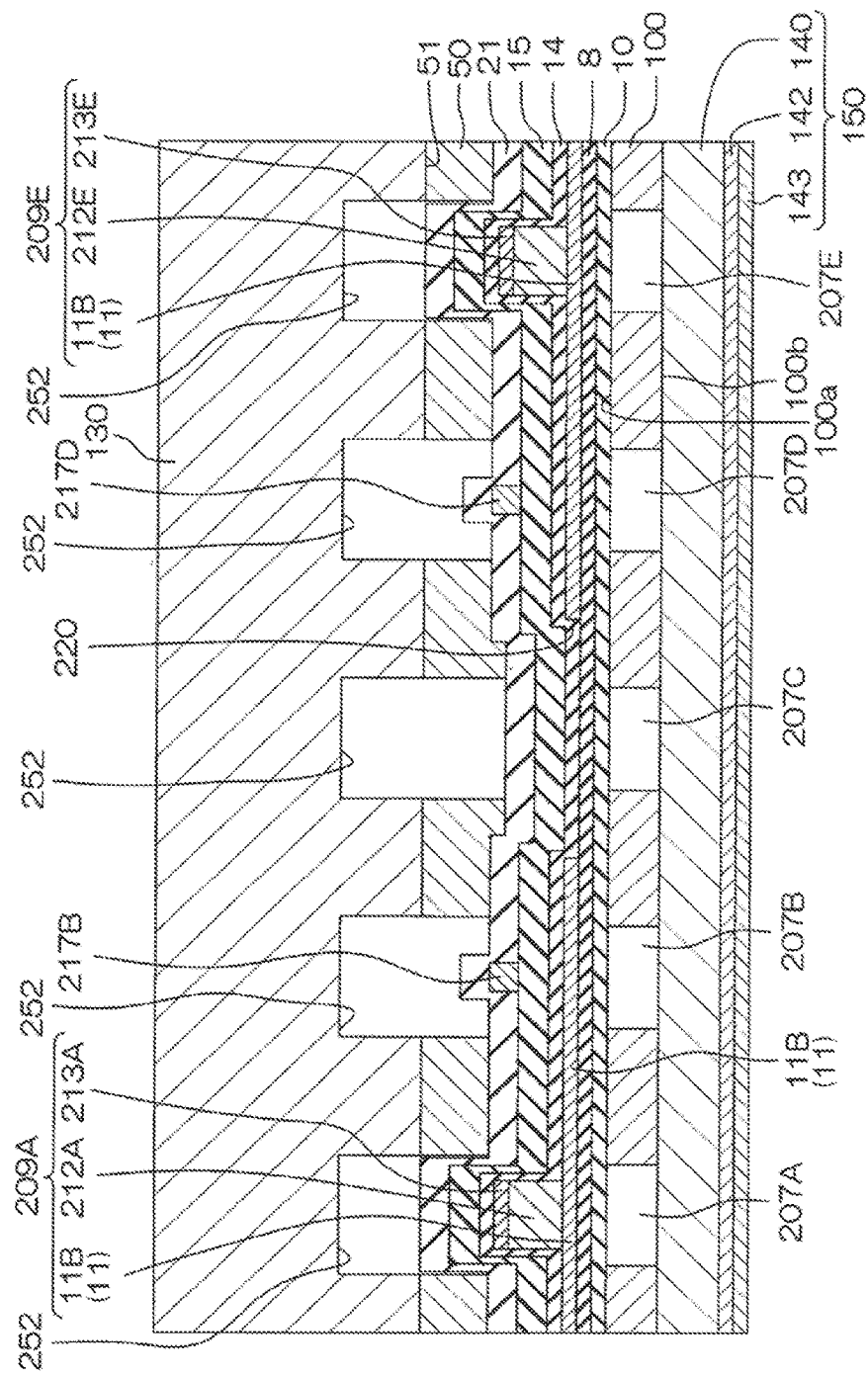
FIG. 14J is a sectional view depicting a step next to FIG. 14I.

Subsequently, as depicted in FIGS. 13L and 14I, back grinding for thinning the actuator wafer 100 is conducted. The actuator wafer 100 is polished from its back side 100b, whereby the actuator wafer 100 is made thinner. For example, the actuator wafer 100 which is approximately 670 μm thick in an initial state may be thinned to a thickness of approximately 300 μm. Thereafter, a resist mask having openings corresponding to the ink flow paths 5 (the ink inflow sections 6 and the pressure chambers 7) and the dummy pressure chambers 207A to 207E is formed on the side of the back side 100b of the actuator wafer 100 by photolithography, and, with this resist mask as a mask, the actuator wafer 100 is etched from the back side 100b. By this, the ink flow paths 5 (the ink inflow sections 6 and the pressure chambers 7) and the dummy pressure chambers 207A to 207E are formed in the actuator wafer 100.

During this etching, the metal barrier film 8 formed on the surface of the movable membrane forming layer 10 prevents metallic elements (Pb, Zr and Ti in the case of PZT) from coming out of the piezoelectric film 12, to thereby maintain good piezoelectric characteristics of the piezoelectric film 12. In addition, as aforementioned, the metal barrier film 8 contributes to maintaining the durability of the silicon layer forming the movable membrane 10A.

Thereafter, as depicted in FIGS. 13M and 14J, the nozzle substrate aggregate 150 is adhered to the back side 100b of the actuator wafer 100. As a result, the ink jet head aggregate 170 including the substrate assembly aggregate 110, the protective substrate aggregate 130 and the nozzle substrate aggregate 150 is obtained. Thereafter, the ink jet head aggregate 170 is cut along the cutting lines 103 by a dicing blade. In other words, a step of obtaining the ink jet print heads 1 individually through cutting is conducted.

When this step is completed, the actuator wafer 100 of the substrate assembly aggregate 110 is turned into the actuator substrates 2 of the individual ink jet print heads 1. In addition, the protective substrate aggregate 130 is turned to be the protective substrates 4 of the individual ink jet print heads 1. Besides, the nozzle wafer 140, the silicon oxide film 142 and the water-repellent film 143 of the nozzle substrate aggregate 150 are turned into the silicon substrates 30, the silicon oxide films 31 and the water-repellent films 32 in the nozzle substrate 3 of the individual ink jet print heads 1. In this way, chips of the ink jet print heads 1 having the structure depicted in FIGS. 1 to 11 are obtained.

In the ink jet print head 1 obtained in this manner, side surfaces of the actuator substrate 2 and side surfaces of the nozzle substrate 3 are flush in all orientations (flush over the whole circumference) in plan view. In other words, in this embodiment, an ink jet print head 1 having no step between the actuator substrate 2 and the nozzle substrate 3 is obtained. In addition, in this embodiment, side surfaces of the actuator substrate 2 and side surfaces of the protective substrate 4 are flush in all orientations (flush over the whole circumference) in plan view. In other words, in this embodiment, an ink jet print head 1 having no step between the actuator substrate 2 and the protective substrate 4 is obtained.

In the method of manufacturing the ink jet print head according to this embodiment, the nozzle substrate aggregate 150 is joined to the substrate assembly aggregate 110 fixed to the protective substrate aggregate 130, to thereby fabricate the ink jet print head aggregate 170. Then, the ink jet print head aggregate 170 is diced, to thereby obtain the ink jet print heads 1 individually. Therefore, the ink jet print head 1 can be manufactured more efficiently as compared to the case wherein, for example, after individual substrate assemblies SA are produced, nozzle substrates 3 are individually joined to the individual substrate assemblies SA to thereby manufacture ink jet print heads.

Figure 15:
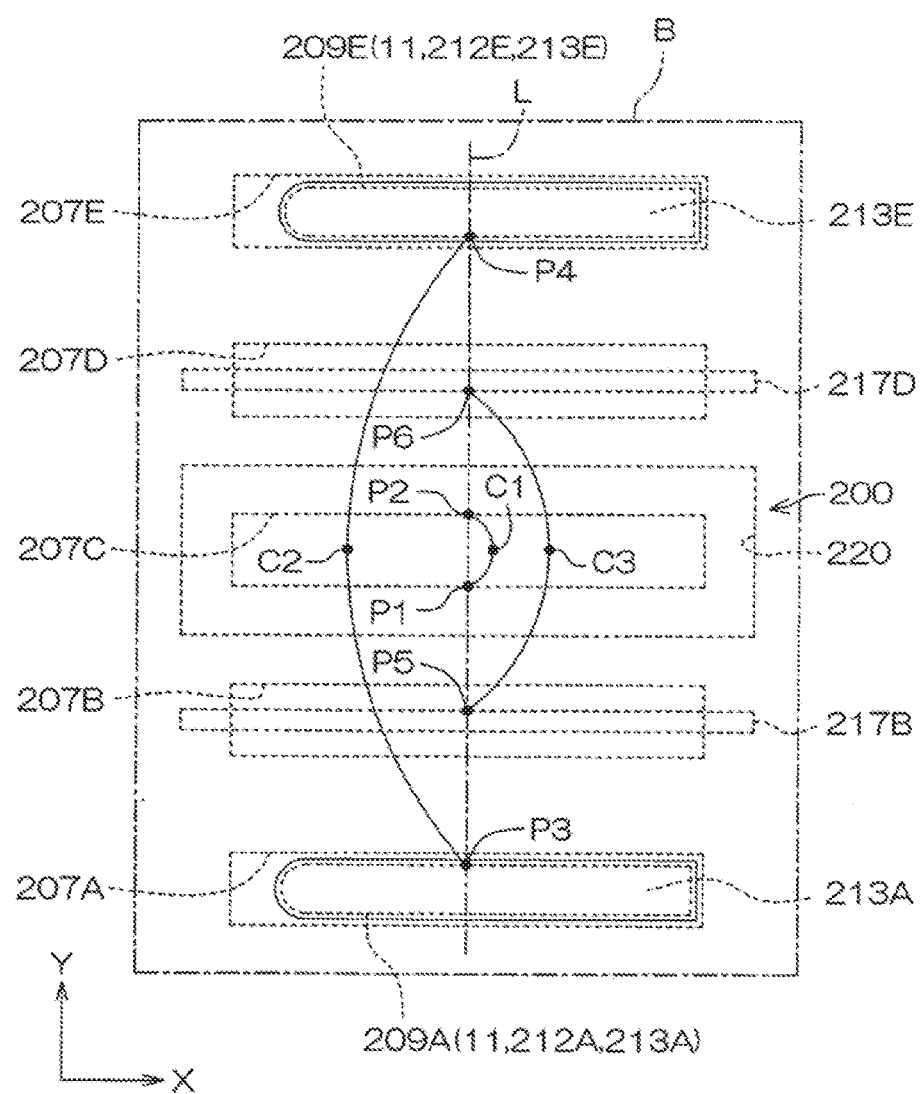
FIG. 15 is a plan view for explaining a method of utilizing a dimension measuring pattern.

Referring to FIG. 15, a method of utilizing the dimension measuring pattern 200 will be described.

The dimension measuring pattern 200 is utilized, for example, after the ink flow paths 5 (the ink inflow sections 6 and the pressure chambers 7) and the dummy pressure chambers 207A to 207E are formed in the actuator wafer 100, namely, after the steps of FIGS. 13L and 14I described above.

In this embodiment, for example, the following measurement or examination is carried out.

(1) Measurement of Width of Pressure Chamber 9

As depicted in FIG. 15, an xy coordinate system having an x-axis in the left-right direction and a y-axis in the front-rear direction is set. A straight line L parallel to the y-axis and intersecting the dummy pressure chambers 207A to 207E is set. In this embodiment, the lower electrode 11 is formed with the cut-away portion 220 including the central dummy pressure chamber 207C in plan view. Therefore, the positions of both side edges of the ceiling surface portion of the central dummy pressure chamber 207C (both side edges of the dummy pressure chamber 207C on the movable membrane 10A side) can be detected by an optical measuring instrument from the protective substrate aggregate 130 side. In view of this, the coordinate positions (x1, y1) and (x2, y2) of intersections P1 and P2 of the side edges of the ceiling surface portion of the central dummy pressure chamber 207C and the straight line L are measured by the optical measuring instrument. Then, the absolute value |y2−y1| of the difference between the y-coordinate y1 of the point P1 and the y-coordinate y2 of the point P2 is measured as the width of the dummy pressure chamber 207C. The width |y2−y1| of the dummy pressure chamber 207C thus obtained can be regarded as the width of the pressure chamber 9.

(2) Measurement of Relative Positional Deviation Amount Between Pressure Chamber 7 and Upper Electrode 13

In the process of manufacturing the ink jet print head 1, the patterning of the pressure chambers 7, the ink flow paths 5 and the dummy pressure chambers 207A to 207E is conducted by aligning an alignment mark formed simultaneously with the formation of the upper electrodes 13 and the dummy upper electrodes 213A and 213E and an alignment mark of the mask used for patterning the pressure chambers 7, the ink flow paths 5 and the dummy pressure chambers 207A to 207E. At the time of an actual treatment, however, an alignment error (deviation) between the alignment marks would not be reduced completely to zero, and a positional deviation would be generated for some reason. As a result, in such a case, a relative positional deviation is generated between the pressure chambers 7 and the upper electrodes 13. In order to examine whether or not a positional deviation is generated between the pressure chambers 7 and the upper electrodes 13 and to examine the size of the deviation, the relative positional deviation amount between the pressure chambers 7 and the upper electrodes 13 is measured.

The coordinate positions (x1, y1) and (x2, y2) of the intersections P1 and P2 between the side edges of the ceiling surface portion of the central dummy pressure chamber 207C and the straight line L are measured. The y-coordinate $\{(y2-y1)/2\}$ of a midpoint C1 between the point P1 and the point P2 is determined.

The coordinate position (x3, y3) of an intersection P3 between that side edge of the dummy upper electrode 213A on one side which is on the side of the central dummy pressure chamber 207C and the straight line L and the coordinate position (x4, y4) of an intersection P4 between that side edge of the dummy upper electrode 213E on the other side which is on the side of the central dummy pressure chamber 207C and the straight line L are determined. The y-coordinate $\{(y4-y3)/2\}$ of a midpoint C2 between the point P3 and the point P4 is determined. Then, the difference between the y-coordinate $\{(y2-y1)/2\}$ of the midpoint C1 and the y-coordinate $\{(y4-y3)/2\}$ of the midpoint C2 is determined as a relative positional deviation amount between the pressure chambers 7 and the upper electrodes 13.

Note that by measuring the distance between the point P1 and the point P3, the difference between this distance and a preset ideal value (the first spacing mentioned above) may be determined as the relative positional deviation amount between the pressure chambers 7 and the upper electrodes 13.

(3) Measurement of Relative Positional Deviation Amount Between Pressure Chamber 7 and Upper Wiring 17

In the process of manufacturing the ink jet print head 1, the patterning of the pressure chambers 7, the ink flow paths 5 and the dummy pressure chambers 207A to 207E is conducted by aligning an alignment mark formed simultaneously with the formation of the upper wirings 17, the lower wiring 18 and the dummy wirings 217B and 217D and an alignment mark of the mask used for patterning the pressure chambers 7, the ink flow paths 5 and the dummy pressure chambers 207A to 207E. At the time of an actual treatment, however, an alignment error (deviation) between the alignment marks would not be reduced completely to zero, and a positional deviation would be generated for some reason. As a result, in such a case, a relative positional deviation is generated between the pressure chambers 7 and the upper wirings 17. In order to examine whether or not a positional deviation is generated between the pressure chambers 7 and the upper wirings 17 and to examine the size of the deviation, the relative positional deviation amount between the pressure chambers 7 and the upper wirings 17 is measured.

The coordinate positions (x1, y1) and (x2, y2) of the intersections P1 and P2 between the side edges of the ceiling surface portion of the central dummy pressure chamber 207C and the straight line L are measured. The y-coordinate $\{(y2-y1)/2\}$ of the midpoint C1 between the point P1 and the point P2 is determined.

The coordinate position (x5, y5) of an intersection P5 between that side edge of the dummy wiring 217B on one side which is on the side of the central dummy pressure chamber 207C and the straight line L and the coordinate position (x6, y6) of an intersection P6 between that side edge of the dummy wiring 217D on the other side which is on the side of the central dummy pressure chamber 207C and the straight line L are determined. The y-coordinate $\{(y6-y5)/2\}$ of a midpoint C3 between the point P5 and the point P6 is determined. Then, the difference between the y-coordinate {(y2−y1)/2} of the midpoint C1 and the y-coordinate {(y6−y5)/2} of the midpoint C3 is determined as a relative positional deviation amount between the pressure chambers 7 and the upper wirings 17.

Note that by measuring the distance between the point P1 and the point P5, the difference between this distance and a preset ideal value (the second spacing mentioned above) may be determined as the relative positional deviation amount between the pressure chambers 7 and the upper wirings 17.

Figure 16:
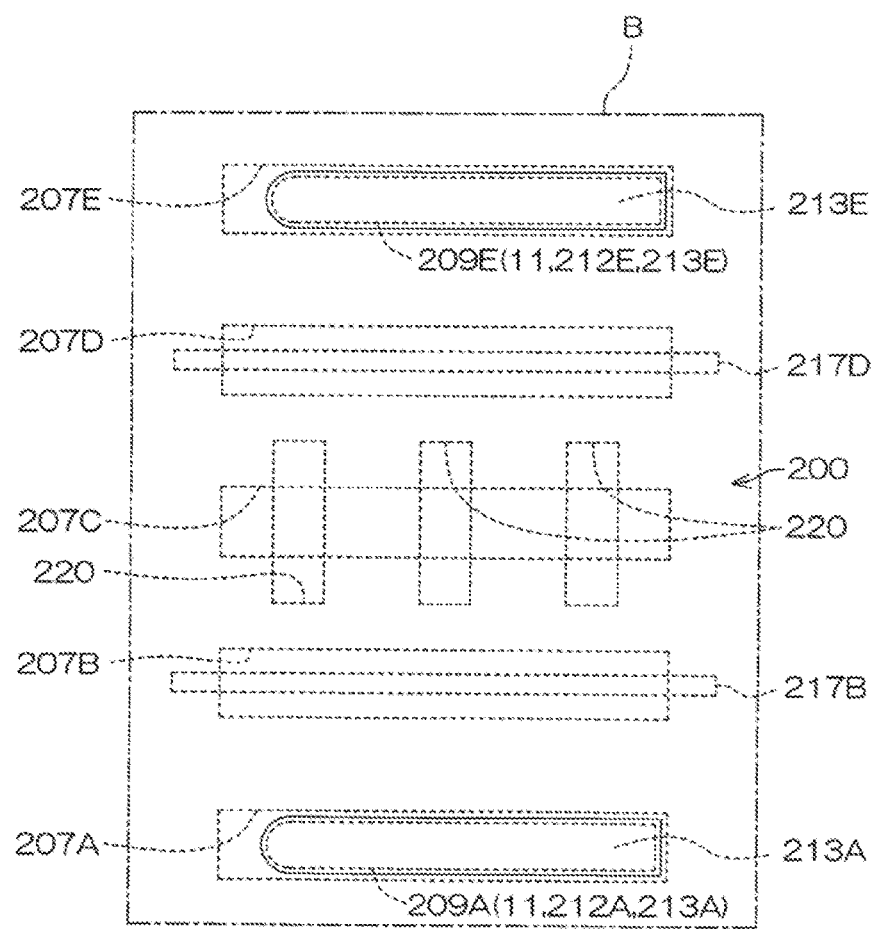
FIG. 16 is a plan view depicting a modification of the dimension measuring pattern.

While an embodiment of the present disclosure has been described above, the present disclosure can be carried out further by other embodiments. For instance, in the above embodiment, the cut-away portion 220 of the lower electrode 11 is formed in a region including the whole part of the dummy pressure chamber 207C, of the lower electrode 11 in plan view. However, the cut-away portion 220 may be formed in a region including part of both side edges of the dummy pressure chamber 207C, of the lower electrode 11 as depicted in FIG. 16. In other words, it is sufficient that the cut-away portion 220 is formed in a region including at least part of both side edges of the dummy pressure chamber 207C, of the lower electrode 11. While three cut-away portions 220 are formed in the example of FIG. 16, only one cut-away portion may be formed.

In addition, while five dummy pressure chambers 207A to 207E are formed in the above embodiment, only the central dummy pressure chamber 207C may be formed. In other words, of the five dummy pressure chambers 207A to 207E, the other dummy pressure chambers 207A, 207B, 207D, and 207E than the dummy pressure chamber 207C may not be formed.

Besides, in the case where examination of the positional deviation amount between the pressure chambers 7 and the upper wirings 17 is not conducted, the dummy wirings 217B and 217D may not be formed. In addition, in the case where examination of the positional deviation amount between the pressure chambers 7 and the upper electrodes 13 is not performed, the dummy piezoelectric elements 209A and 209E may not be formed.

Besides, while two piezoelectric element columns (pressure chamber columns) are provided in the actuator substrate 2, only one piezoelectric element column (pressure chamber column) may be provided, or three or more piezoelectric element columns (pressure chamber columns) may be provided.

In addition, while the insulating film 15 is formed on part of the surface of the hydrogen barrier film 14 in the above embodiment, the insulating film 15 may be formed over the whole region of the surface of the hydrogen barrier film 14.

Besides, while the insulating film 15 is formed on part of the surface of the hydrogen barrier film 14 in the above embodiment, the insulating film 15 may be absent.

In addition, while PZT has been mentioned as a material for the piezoelectric film in the above embodiment, there may be applied other piezoelectric materials composed of metallic oxides, typical examples of which include lead titanate (PbTiO3), potassium niobate (KNbO3), lithium niobate (LiNbO3), and lithium tantalate (LiTaO3).

The present disclosure may be practiced or embodied in still other ways without departing from the spirit or essential character thereof. The preferred embodiment described herein is therefore illustrative and not restrictive, the scope of the present disclosure being indicated by the appended claims and all variations which come within the meaning of the claims are intended to be embraced therein.

What is claimed is:

1. An ink jet print head, comprising:
    an actuator substrate having an ink flow path including a pressure chamber;
    a movable membrane forming layer including a movable membrane which is disposed on the pressure chamber and which defines a ceiling surface portion of the pressure chamber;
    a piezoelectric element which is formed on the movable membrane and which includes a lower electrode, a piezoelectric film formed on the lower electrode and an upper electrode formed on the piezoelectric film, with the pressure chamber, the movable membrane and the upper electrode having a rectangular shape elongated in one direction in plan view as viewed from a direction normal to the movable membrane, the lower electrode including a main electrode section constituting the piezoelectric element and an extension section extending from the main electrode section along a surface of the movable membrane forming layer; and
    a dimension measuring pattern related to the pressure chamber,
    the dimension measuring pattern including a dummy pressure chamber which is formed in the actuator substrate and which is identical in pattern to the pressure chamber, the lower electrode being formed with a cut-away portion in a region including at least part of both side edges of the dummy pressure chamber in the plan view,
    wherein the dimension measuring pattern further includes a dummy upper electrode for examining a relative positional deviation between the pressure chamber and the upper electrode,
    the dummy upper electrode is formed on at least one of both lateral sides of the dummy pressure chamber in the plan view, on the movable membrane forming layer, and the dummy upper electrode is disposed spaced from the dummy pressure chamber by a predetermined first spacing.

2. The ink jet print head according to claim 1, wherein the dummy pressure chamber is formed in the same step as a step of forming the pressure chamber.

3. The ink jet print head according to claim 1, wherein the dummy upper electrode includes:
    a first dummy upper electrode which is formed on a first side of a first side edge of the dummy pressure chamber and which is disposed spaced from the first side edge by the predetermined first spacing, in the plan view, and
    a second dummy upper electrode which is formed on a second side of a second side edge of the dummy pressure chamber and which is formed spaced from the second side edge by the predetermined first spacing, in the plan view.

4. The ink jet print head according to claim 1, wherein the dummy upper electrode is formed in the same step as a step of forming upper electrodes of a plurality of piezoelectric elements including the piezoelectric element.

5. The ink jet print head according to claim 1, further comprising:
    an upper wiring which is disposed on the movable membrane forming layer and which is connected to an upper electrode of each piezoelectric element, wherein the dimension measuring pattern further includes a dummy wiring for examining a relative positional deviation between the pressure chamber and the upper wiring, and the dummy wiring includes a rectilinear dummy wiring which is formed on a side of at least one of the both side edges of the dummy pressure chamber and which is disposed spaced from a side edge by a predetermined second spacing, in the plan view, on the movable membrane forming layer.

6. The ink jet print head according to claim 5, wherein the dummy wiring includes:
   a first dummy wiring which is formed on a first side of a first side edge of the dummy pressure chamber and which is disposed spaced from the first side edge by the predetermined second spacing, in the plan view, and
   a second dummy wiring which is formed on a second side of a second side edge of the dummy pressure chamber and which is disposed spaced from the second side edge by the predetermined second spacing.

7. The ink jet print head according to claim 5, wherein the dummy wiring is formed in the same step as a step of forming the upper wiring.

8. The ink jet print head according to claim 5, further comprising:
   a hydrogen barrier film covering at least whole region of side surfaces of the upper electrode and the piezoelectric film and an upper surface of the lower electrode; and
   an insulating film which is formed on the hydrogen barrier film and which is disposed between the hydrogen barrier film and the upper wiring, wherein the hydrogen barrier film and the insulating film are formed with a contact hole for exposing part of the upper electrode, wherein an end portion of the upper wiring is connected to the upper electrode through the contact hole.

9. The ink jet print head according to claim 8, further comprising a passivation film which is formed on the insulating film and which coats the upper wiring.

10. The ink jet print head according to claim 1, wherein the lower electrode is formed with the cut-away portion in a region including whole part of the dummy pressure chamber in the plan view.

11. A method of manufacturing an ink jet print head, comprising:
    forming a movable membrane forming layer including a movable membrane forming region on an actuator substrate;
    forming a piezoelectric element in the movable membrane forming region, the piezoelectric element including a lower electrode, an upper electrode disposed on an opposite side of the lower electrode from the movable membrane forming layer, and a piezoelectric film interposed between the lower electrode and the upper electrode;
    forming a pressure chamber opposed to the movable membrane forming region and forming a dummy pressure chamber, by etching the actuator substrate from below,
    wherein the pressure chamber, the dummy pressure chamber, the movable membrane forming region and the upper electrode have a rectangular shape elongated in one direction in a plan view as viewed from a direction normal to the movable membrane forming region, and the lower electrode includes a main electrode section constituting the piezoelectric element and an extension section extending from the main electrode section along a surface of the movable membrane forming layer,
    wherein, the lower electrode is formed with a cut-away portion in a region including at least part of both side edges of the dummy pressure chamber in the plan view; and
    forming a dimension measuring pattern related to the pressure chamber, wherein the dimension measuring pattern further includes a dummy upper electrode for examining a relative positional deviation between the pressure chamber and the upper electrode,
    the dummy upper electrode is formed on at least one of both lateral sides of the dummy pressure chamber in the plan view, on the movable membrane forming layer, and the dummy upper electrode is disposed spaced from the dummy pressure chamber by a predetermined first spacing.

12. A method of manufacturing an ink jet print head, comprising:
    forming a movable membrane forming layer including a movable membrane forming region on an actuator substrate;
    forming a piezoelectric element on the movable membrane forming region, the piezoelectric element including a lower electrode, an upper electrode disposed on an opposite side of the lower electrode from the movable membrane forming layer, and a piezoelectric film interposed between the lower electrode and the upper electrode, and forming a dummy piezoelectric element including a dummy upper electrode on the movable membrane forming layer; and
    forming a pressure chamber opposed to the movable membrane forming region and forming a dummy pressure chamber, by etching the actuator substrate from below,
    wherein the pressure chamber, the dummy pressure chamber, the movable membrane forming region, the upper electrode and the dummy upper electrode have a rectangular shape elongated in one direction in a plan view as viewed from a direction normal to the movable membrane forming region, the dummy upper electrode includes a dummy upper electrode which is formed on at least one of both lateral sides of the dummy pressure chamber in the plan view and which is disposed spaced from the dummy pressure chamber by a predetermined first spacing, and the lower electrode includes a main electrode section constituting the piezoelectric element and an extension section extending from the main electrode section along a surface of the movable membrane forming layer, and
    the lower electrode is formed with a cut-away portion in a region including at least part of both side edges of the dummy pressure chamber in the plan view.

13. The method of manufacturing the ink jet print head according to claim 12,
    wherein the dummy upper electrode includes:
    a first dummy upper electrode which is formed on a side of a first side edge of the dummy pressure chamber and which is disposed spaced from the first side edge by the predetermined first spacing, in the plan view, and
    a second dummy upper electrode which is formed on a side of a second side edge of the dummy pressure chamber and which is formed spaced from the second side edge by the predetermined first spacing, in the plan view.

14. The method of manufacturing the ink jet print head according to claim 12, further comprising:

forming an upper wiring connected to an upper electrode of each piezoelectric element and a dummy wiring, wherein the dummy wiring includes a rectilinear dummy wiring which is formed on a side of at least one of the both side edges of the dummy pressure chamber and which is disposed spaced from a side edge by a predetermined second spacing, in the plan view, on the movable membrane forming layer.

15. The method of manufacturing the ink jet print head according to claim 14, wherein the dummy wiring includes:
   a first dummy wiring which is formed on a side of a first side edge of the dummy pressure chamber and which is disposed spaced from the first side edge by the predetermined second spacing, in the plan view, and
   a second dummy wiring which is formed on the side of a second side edge of the dummy pressure chamber and which is to be disposed spaced from the second side edge by the predetermined second spacing.

16. An ink jet print head, comprising:
an actuator substrate having an ink flow path including a pressure chamber;
a movable membrane forming layer including a movable membrane which is disposed on the pressure chamber and which defines a ceiling surface portion of the pressure chamber;
a piezoelectric element which is formed on the movable membrane and which includes a lower electrode, a piezoelectric film formed on the lower electrode and an upper electrode formed on the piezoelectric film, with the pressure chamber, the movable membrane and the upper electrode having a rectangular shape elongated in one direction in plan view as viewed from a direction normal to the movable membrane, the lower electrode including a main electrode section constituting the piezoelectric element and an extension section extending from the main electrode section along a surface of the movable membrane forming layer;
a dimension measuring pattern related to the pressure chamber,
the dimension measuring pattern including a dummy pressure chamber which is formed in the actuator substrate and which is identical in pattern to the pressure chamber,
the lower electrode being formed with a cut-away portion in a region including at least part of both side edges of the dummy pressure chamber in the plan view; and
an upper wiring which is disposed on the movable membrane forming layer and which is connected to an upper electrode of each piezoelectric element,
wherein the dimension measuring pattern further includes a dummy wiring for examining a relative positional deviation between the pressure chamber and the upper wiring, and
the dummy wiring includes a rectilinear dummy wiring which is formed on a side of at least one of both side edges of the dummy pressure chamber and which is disposed spaced from a side edge of the dummy pressure chamber by a predetermined spacing, in the plan view, on the movable membrane forming layer.

* * * * *